(12) United States Patent
You

(10) Patent No.: US 8,207,050 B2
(45) Date of Patent: *Jun. 26, 2012

(54) LASER MASK AND CRYSTALLIZATION METHOD USING THE SAME

(75) Inventor: JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/050,789

(22) Filed: Mar. 17, 2011

(65) Prior Publication Data

US 2011/0171769 A1  Jul. 14, 2011

Related U.S. Application Data

(62) Division of application No. 12/320,939, filed on Dec. 9, 2009, now Pat. No. 7,927,936, which is a division of application No. 11/013,876, filed on Dec. 17, 2004, now Pat. No. 7,501,211.

(30) Foreign Application Priority Data

Dec. 29, 2003  (KR) .................................. 2003-99390

(51) Int. Cl.
    *H01L 21/20* (2006.01)
(52) U.S. Cl. ...... 438/487; 438/166; 430/5; 257/E21.134
(58) Field of Classification Search .................. 438/487, 438/166; 430/5; 257/E21.134
    See application file for complete search history.

(56) References Cited

U.S. PATENT DOCUMENTS

| 6,410,368 | B1  | 6/2002  | Kawasaki et al. |
|-----------|-----|---------|-----------------|
| 7,316,871 | B2  | 1/2008  | You             |
| 7,892,955 | B2* | 2/2011  | You ............................. 438/487 |
| 2002/0104750 | A1 | 8/2002 | Ito             |
| 2002/0168577 | A1 | 11/2002 | Yoon           |
| 2002/0179001 | A1 | 12/2002 | Jung           |
| 2002/0197759 | A1 | 12/2002 | Yang           |
| 2003/0088848 | A1 | 5/2003  | Crowder        |

FOREIGN PATENT DOCUMENTS

| CN | 1388564 A       | 1/2003  |
| CN | 1389600 A       | 1/2003  |
| JP | 2002-351055 A   | 12/2002 |
| WO | WO 01/18854     | 3/2001  |
| WO | WO 03/043093 A1 | 5/2003  |
| WO | WO 2004/017382 A3 | 2/2004 |

* cited by examiner

*Primary Examiner* — Jack Chen
(74) *Attorney, Agent, or Firm* — McKenna, Long, and Aldridge, LLP

(57) ABSTRACT

A crystallization method includes providing a substrate having a silicon thin film; positioning a laser mask having first to fourth blocks on the substrate, each block having a periodic pattern including a plurality of transmitting regions and a blocking region; and crystallizing the silicon thin film by irradiating a laser beam through the laser mask. A polycrystalline silicon film crystallized by this method is substantially free from a shot mark, and has uniform crystalline characteristics.

13 Claims, 22 Drawing Sheets

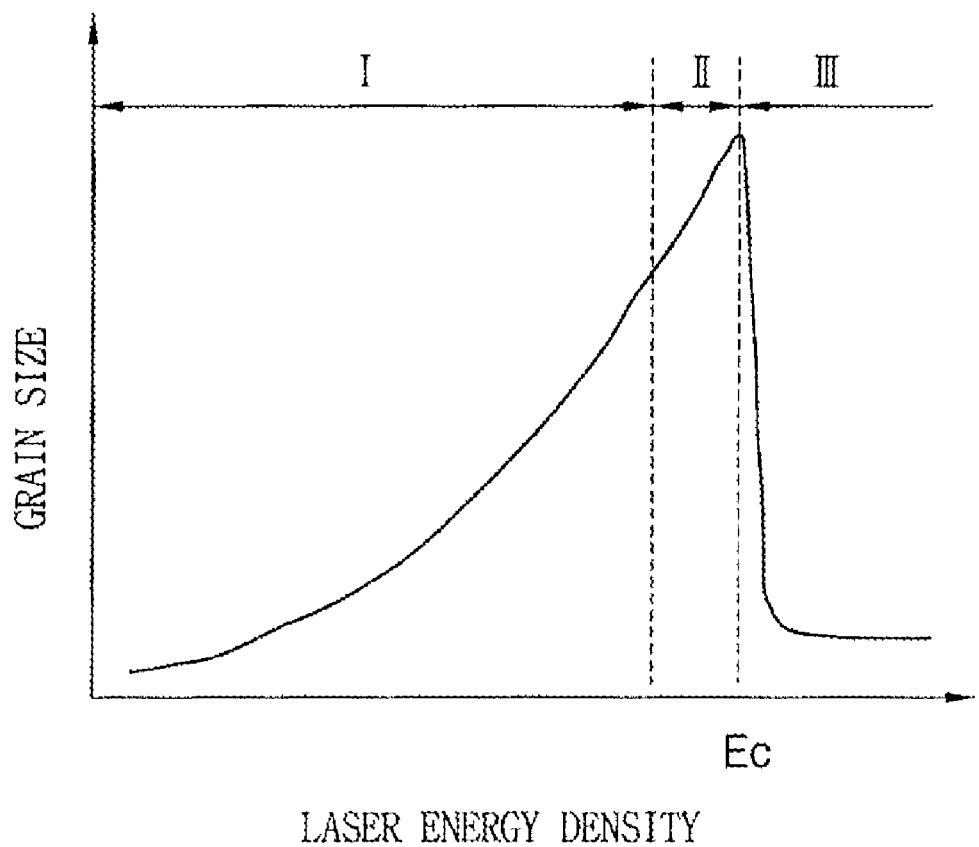

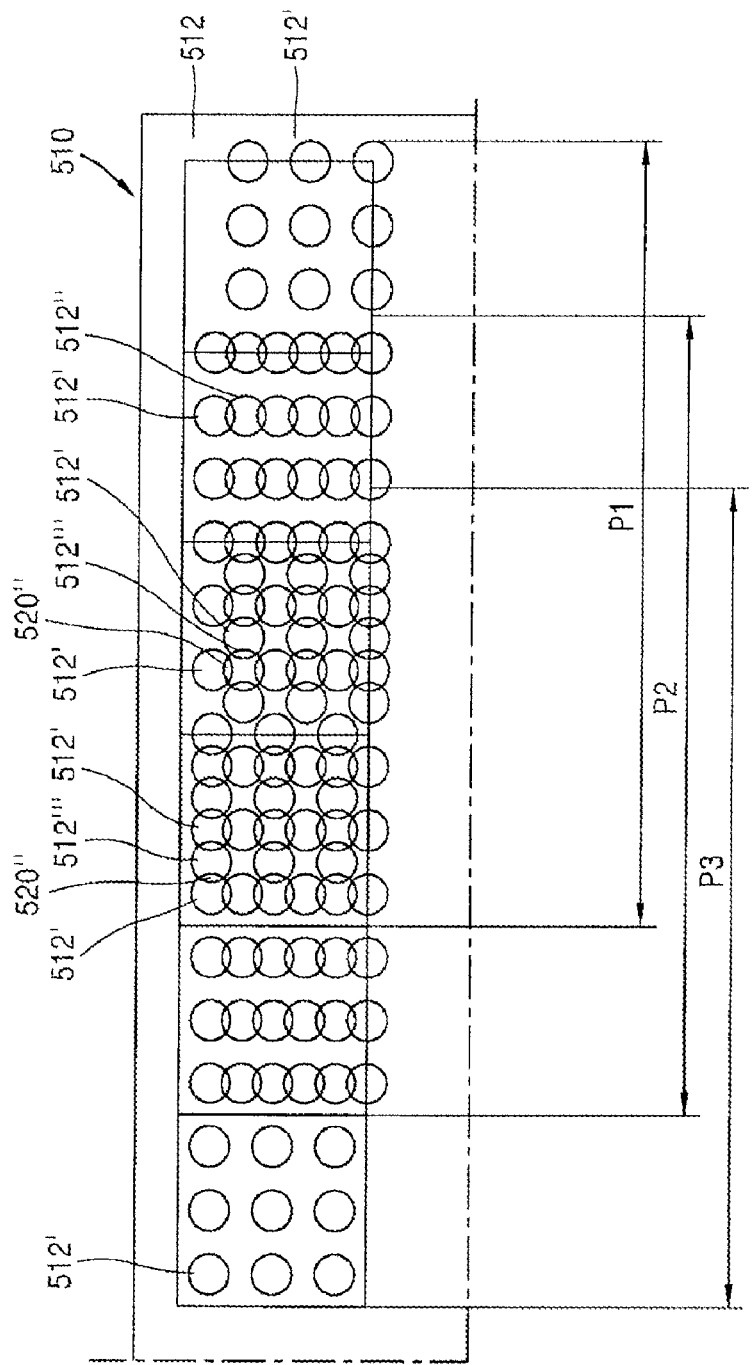

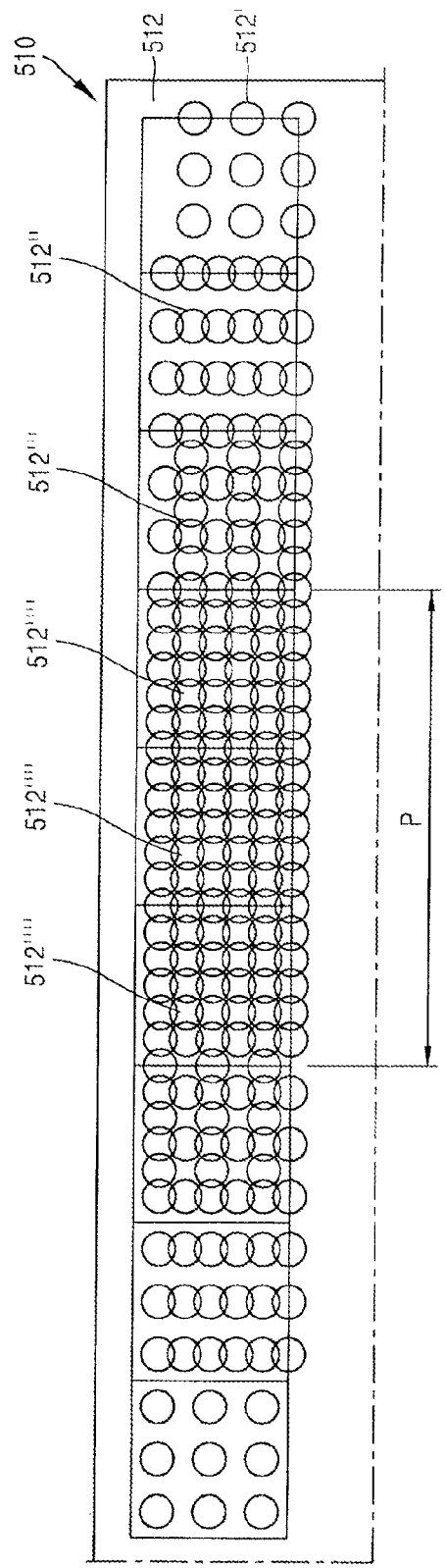

LASER MASK AND CRYSTALLIZATION METHOD USING THE SAME

This is a Divisional Application of U.S. patent application Ser. No. 12/320,939, filed on Dec. 9, 2009 now U.S. Pat. No. 7,927,936, which is a divisional of U.S. patent application Ser. No. 11/013,876, filed on Dec. 17, 2004 now U.S. Pat. No. 7,501,211; which claims priority of Korean Patent Application No. 2003-99390, filed on Dec. 29, 2003, all of which are incorporated herein by reference in their entirety.

BACKGROUND OF THE INVENTION

1. Field of the Invention

The present invention relates to a laser mask and a crystallization method using the same, and more particularly, to a laser mask and a crystallization method using the same that can improve the crystallization characteristics of silicon thin film.

2. Discussion of the Related Art

Recently, due to the needs for information displays, especially for portable information displays, thin film type flat panel display (FPD) devices have been actively being researched and commercialized such that the cathode ray tubes (CRT) are being replaced. Of these flat panel display devices, a liquid crystal display (LCD) device displays images using an optical anisotropy of liquid crystal. An LCD device can be used for notebook computers, desktop monitors, and other display devices, due to its excellent resolution, color rendering capability and picture quality.

An active matrix (AM) driving method, a typical driving method used in the LCD device, drives each of the pixels of the LCD device using an amorphous silicon thin film transistor (a-Si TFT) as a switching device. The a-Si TFT technique was described by English LeComber et al. in 1979, and was commercialized as a three-inch liquid crystal portable television in 1986. Recently, a TFT-LCD device with a display area of more than 50 inches has been developed. However, the field effect mobility of the a-Si TFT is about 1 $cm^2$/Vsec, which prevents its use in peripheral circuits that apply signals to the pixels, because the peripheral circuits generally operate at more than 1 MHz. Accordingly, research for simultaneously forming switching transistors in a pixel region and peripheral circuits in a driving circuit region on a glass substrate using a polycrystalline silicon (poly-Si) TFT having a field effect mobility greater than that of the a-Si TFT have been actively pursued.

The poly-Si TFT has been applied to small flat panel displays, such as the eyepiece of camcorders, since an LCD color television was developed in 1982. Such a TFT has low photosensitivity and high field effect mobility, and it can be directly fabricated on a substrate to form driving circuits. Increased mobility can increase the operation frequency of the driving circuits. The frequency capability of the driving circuits determines the number of the pixels that can be driven while maintaining adequate display capability. More specifically, the increased frequency decreases the charging time of a signal applied to a pixel such that distortion of the signal is decreased and the picture quality increases. Compared to the a-Si TFT, which has a high driving voltage of about 25V, the poly-Si TFT, which has a driving voltage of under 10V, consumes less power.

The poly-Si TFT can be fabricated by directly depositing a polycrystalline silicon thin film on a substrate or by depositing an amorphous silicon thin film that is then crystallized by a thermal process. To use a cheap glass as a substrate, low temperature processes are required, and, to use the poly-Si TFT for driving circuits, a method for increasing the field effect mobility is required. In general, thermal processing methods for crystallizing an amorphous silicon thin film are the solid phase crystallization (SPC) method and the excimer laser annealing (ELA) method.

The SPC method forms a polycrystalline silicon thin film at a low temperature of approximately 600° C. In this method, a polycrystalline silicon thin film is formed by depositing an amorphous silicon thin film on a glass substrate having a low melting point and then by performing a slow heating process at approximately 600° C. for up to tens of hours. A polycrystalline silicon thin film obtained by the SPC method has comparatively large-size grains of about several μm (micrometers). However, there are many defects in the grains. Although not as bad as grain boundaries in a poly-Si TFT, these defects negatively affect the performance of a poly-Si TFT.

The excimer laser annealing method is a typical method of fabricating a poly-Si TFT at a low temperature. The excimer laser crystallizes an amorphous silicon thin film by irradiating a high energy laser beam onto the amorphous silicon thin film for a time of ten nanoseconds. In this method, the amorphous silicon is melted and crystallized in a very short time, so that the glass substrate is not damaged. A polycrystalline silicon thin film fabricated by the excimer laser method also has excellent electrical characteristics, compared to a poly-Si thin film fabricated by a general thermal processing method. For example, a field effect mobility of a poly-Si TFT fabricated by the excimer laser method is more than 100 $cm^2$/Vsec, whereas a field effect mobility of an a-Si TFT is 0.1~0.2 $cm^2$/Vsec and a field effect mobility of a poly-Si TFT fabricated by a general thermal processing method is 10~20 $cm^2$/Vsec (IEEE Trans. Electron Devices, vol. 36, no. 12, p. 2868, 1989).

A crystallization method using a laser will now be described in detail. FIG. 1 is a graph illustrating a relationship between a grain size of a polycrystalline silicon thin film and an energy density of a laser used to form the polycrystalline silicon thin film.

As shown in FIG. 1, in the first and second regions I and II, as the energy density increases, the grain size of the polycrystalline silicon thin film increases, as discussed in IEEE Electron Device Letters, DEL-7, 276, 1986. However, in the third region III, when the energy density becomes higher than a specific energy density Ec, the grain size of the crystallized polycrystalline silicon thin film decreases drastically. That is, according to the graph shown in FIG. 1, the crystallization mechanism for the silicon thin film becomes different when the energy density is higher than a specific energy density Ec.

FIGS. 2A to 2C, 3A to 3C and 4A to 4C are sectional views illustrating silicon crystallization mechanisms according to the laser energy densities of FIG. 1. That is, they illustrate sequential crystallization process according to each laser energy density. A crystallization mechanism of amorphous silicon by a laser annealing is influenced by many factors, such as laser irradiation conditions including laser energy density, irradiation pressure, substrate temperature, and physical/geometrical characteristics including absorption coefficient, thermal conductivity, mass, impurity containing degree and amorphous silicon layer thickness.

First, as shown in FIGS. 2A to 2C, the first region (I) of FIG. 1 is a partial melting region, and an amorphous silicon thin film 12 is crystallized only up to the dotted line and a size of a grain G1 formed at this time is about hundreds Å. When a laser beam is irradiated on the amorphous silicon thin film 12 on a substrate 10 where a buffer layer 11 is formed, the amorphous silicon thin film 12 is melted. At this time, because strong laser energy is irradiated directly at a surface of the amorphous silicon thin film 12 and relatively weak laser energy is irradiated at a lower portion of the amorphous silicon thin film 12, a certain portion of the amorphous silicon thin film 12 is melted. As a result, crystallization is partially performed.

Typically, in the laser crystallization method, crystals grow through the processes of primary melting in which a surface layer of an amorphous silicon thin film is melted by a laser irradiation, secondary melting in which a lower portion of the amorphous silicon thin film is melted by the latent heat generated during the solidification of the melted silicon, and the solidification of the lower layer. These crystal growth processes will be explained in more detail.

An amorphous silicon thin film on which a laser beam is irradiated has a melting temperature of more than 1000° C. and primarily melts into a liquid state. Because there is a great temperature difference between the surface melted layer and the lower silicon and substrate, the surface melted layer cools fast until solid phase nucleation and solidification are achieved. The surface layer remains melted until the solid phase nucleation and solidification are completed. The melting state lasts for a long time when the laser energy density is high or thermal emission to the outside is low. Because the surface layer melts at a lower temperature than the melting temperature of 1400° C. for crystalline silicon, the surface layer cools and maintains a super-cooled state where the temperature is lower than the phase transition temperature.

The greater the super-cooling state is, that is, the lower the melting temperature of the thin film or the faster the cooling speed is, the greater the nucleation rate is at the time of the solidification such that fine crystals grow during the solidification. When the solidification starts as the melted surface layer cools, crystals grow in an upward direction from a crystal nucleus. At this time, latent heat is generated during the phase transition of the melted surface layer from liquid state to solid state, and thus the secondarily melting begins where the lower amorphous silicon thin film melts. Then, the solidification of the lower amorphous silicon thin film occurs. At this time, the nucleus generation rate of the lower second melted layer increases, because the lower amorphous silicon thin film is more super-cooled than the first melted layer. Thus, the crystal size resulting from the second melted layer is smaller Accordingly, the cooling speed of the solidification has to be reduced to improve the crystalline characteristics. Cooling speed can be reduced by restraining absorbed laser energy from being emitted to the outside. Examples of the restraining method are heating the substrate, double beam irradiation, or inserting a buffer insulating layer between the substrate and the amorphous silicon layer.

FIGS. 3A to 3C are sectional views illustrating the silicon crystallization mechanism of the second region (II) of FIG. 1, in which the second region (II) represents a near-completely crystallized region.

Referring to FIGS. 3A to 3C, a polycrystalline silicon thin film has relatively large grains 30A-30C of about 3000 to 4000 Å formed down to the interface of the lower buffer layer 11. When a nearly complete melting energy, not a complete melting energy, is irradiated on the amorphous silicon thin film 12, almost all of the amorphous silicon thin film 12 down close to the buffer layer 11 melts. At this time, solid seeds 35 that have not been melted at the interface between the melted silicon thin film 12' and the buffer layer 11 work as a crystallization nucleus to induce side growth, thereby forming the relatively large grains 30A-30C (J. Appl. Phys. 82, 4086). However, because this crystallization only occurs when the laser energy is such that the solid seeds 35 remain on the interface with the buffer layer 11, the process margin is very limited. In addition, because the solid seeds 35 are generated non-uniformly, the crystallized grains 30A-30C of the polycrystalline silicon thin film have different crystallization directions, thereby resulting in non-uniform crystallization characteristics.

FIGS. 4A to 4C are sectional views illustrating the silicon crystallization mechanism of the third region (III) of FIG. 1 corresponding to a completely crystallized region.

Referring to FIGS. 4A to 4C, very small grains 30 are irregularly formed with energy density corresponding to the third region (III). When the laser energy density becomes higher than a specific energy density Ec, sufficient energy is applied enough to completely melt the amorphous silicon thin film 12, leaving no solid seeds that may be grown to grains. Thereafter, the silicon thin film 12' which has been melted upon receiving the laser beam of the strong energy undergoes a rapid cooling process, which generates a plurality of uniform nuclei 35 and thus fine grains 30.

Meanwhile, an excimer laser annealing method employing a pulse-type laser is typically used for the laser crystallization, and a sequential lateral solidification (SLS) method, which shows remarkable improvement of crystallization characteristics by growing grains in a horizontal direction, has recently been proposed and studied widely.

The sequential lateral solidification (SLS) utilizes the fact that grains grow laterally from an interface between liquid phase silicon and solid phase silicon (Robert S. Sposilli, M. A. Crowder, and James S. Im, Mat. Res. Soc. Symp. Proc. Vol. 452, 956 to 957, 1997). In this method, grains grow laterally with a predetermined length by controlling the laser energy density and irradiation range of a laser beam, thereby increasing the size of silicon grains.

This SLS is one example of lateral solidification (LS), and the crystallization mechanism with respect to the LS will now be described with reference to the accompanying drawings. FIGS. 5A to 5C are sectional views illustrating a sequential crystallization process according to a related art.

Referring to FIG. 5A, when a laser having an energy density in the third region (III) of FIG. 1, the energy density capable of completely melting an amorphous silicon thin film 112, is irradiated onto a portion of an amorphous silicon thin film 112, the portion of the amorphous silicon film completely melts. A patterned mask can be employed to form a laser irradiated region and a laser non-irradiated region. At this time, as shown in FIGS. 5B and 5C, because the laser has sufficient energy, the amorphous silicon thin film 112 irradiated by the laser can be completely melted. However, the laser beam is irradiated with certain intervals on the amorphous silicon thin film 112, crystals grow from the interface between the silicon thin film 112 of the laser non-irradiated region (solid phase) and the melted silicon thin film 112' (liquid phase).

Thus, the interface provides nuclei for this crystallization. In other words, immediately after the laser beam is irradiated, the melted silicon thin film 112' cools from the left/right surfaces, the interfaces of the laser non-irradiated region. This is because the solid phase amorphous silicon thin film 112 has higher heat conductivity than the buffer layer 111 or the glass substrate 110 below the silicon thin films 112 and 112'. Accordingly, the melted silicon thin film 112' first reaches a nucleus formation temperature at the interface between the horizontal solid phase and the liquid phase, rather than at the central portion, forming a crystal nucleus at the corresponding portion. After the crystal nucleus is formed, grains 130A and 130B horizontally grow from a low temperature side to a high temperature side, that is, from the interface to the central portion. Due to the lateral crystallization, large-size grains 130A and 130B can be formed, and because the process is performed with the energy density of the third region, the process margin is not limited, compared to other regions. However, the SLS has the following problems.

That is, the crystallization is performed by infinitesimally and repeatedly moving the mask or the stage in order to increase the size of the grains. As a result, the process time for crystallizing a large-size amorphous silicon thin film is lengthened and the process yield becomes low.

SUMMARY OF THE INVENTION

Accordingly, the present invention is directed to a laser mask and a crystallization method using the same that substantially obviates one or more of the problems due to limitations and disadvantages of the related art.

An advantage of the present invention is to provide a laser mask and a crystallization method using the same that can improve the crystallization characteristics of silicon thin film.

Still another advantage of the present invention is to provide a liquid crystal display device including a silicon thin film having improved crystallization characteristics fabricated by the crystallization method described herein.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a laser mask includes first to fourth blocks, each block having a periodic pattern including a plurality of transmitting regions and a blocking region.

In the laser mask, a first mask pattern with a position 'A', a second mask pattern with a position of 'B', a third mask pattern with a position of 'C' and a fourth mask pattern with a position of 'D' are formed in the first to fourth blocks, respectively, and the positions 'A' to 'D' are different from each other.

In another aspect of the present invention, a crystallization method includes providing a substrate having a silicon thin film; positioning a laser mask having first to fourth blocks on the substrate, each block having a periodic pattern including a plurality of transmitting regions and a blocking region; and crystallizing the silicon thin film by irradiating a laser beam through the laser mask.

In another aspect of the present invention, a display device includes a gate line and a data line crossing each other to form a pixel; and a thin film transistor (TFT) near the crossing, the TFT including a polycrystalline silicon layer, wherein the polycrystalline silicon layer includes a plurality of circular crystals, and the centers of the four adjacent circular crystals form one equilateral rectangle.

In another aspect of the present invention, a display device includes a gate line and a data line crossing each other to form a pixel; and a thin film transistor (TFT) near the crossing, the TFT including a polycrystalline silicon layer, wherein the polycrystalline silicon layer includes a plurality of crystals having a polygon shape, and the centers of the four adjacent crystals form one equilateral rectangle.

In still another aspect of the present invention, a method for fabricating a display device includes forming a plurality of gate lines and data lines on a substrate, the gate and data lines crossing each other to define pixels; and forming a thin film transistor (TFT) near each crossing in the pixel, this step further including, providing a substrate having a silicon thin film, positioning a laser mask having first to fourth blocks on the substrate, each block having a periodic pattern including a plurality of transmitting regions and a blocking region, crystallizing the silicon thin film by irradiating a laser beam through the laser mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a graph illustrating a relationship between a grain size of a polycrystalline silicon thin film and an energy density of a laser used to form the polycrystalline silicon thin film;

FIGS. 14A to 14G illustrate a sequential process for crystallizing a silicon thin film using the laser mask illustrated in FIG. 13B;

DETAILED DESCRIPTION OF THE PREFERRED EMBODIMENTS

Reference will now be made in detail to the embodiments of the present invention, examples of which are illustrated in the accompanying drawings.

Figure 2A:
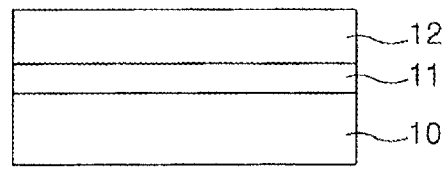
FIGS. 2 to 4 are sectional views illustrating silicon crystallization mechanisms according to the laser energy densities of FIG. 1.
Figure 2B:
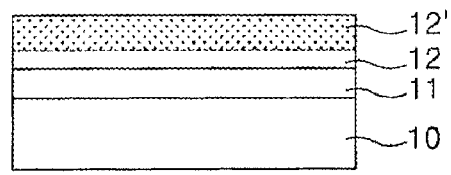
Figure 2C:
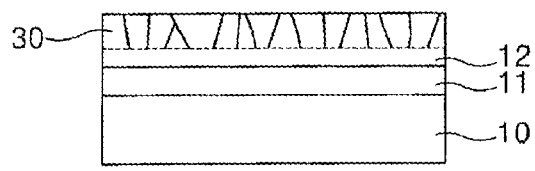
Figure 3A:
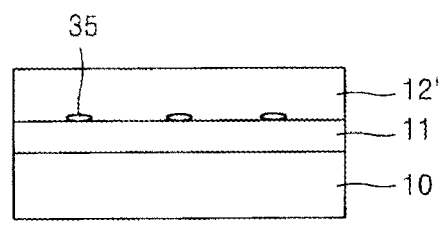
Figure 3B:
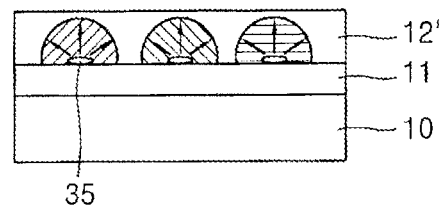
Figure 3C:
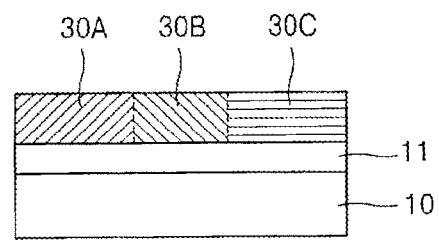
Figure 4A:
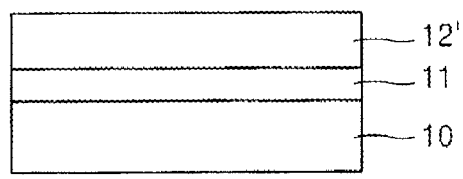
Figure 4B:
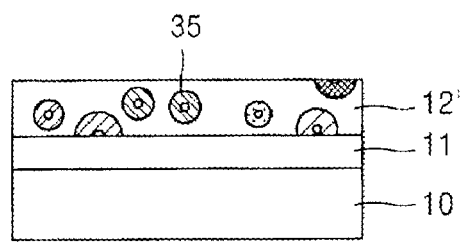
Figure 4C:
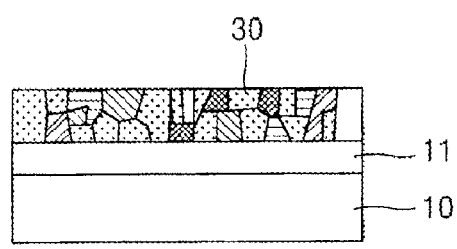
Figure 5A:
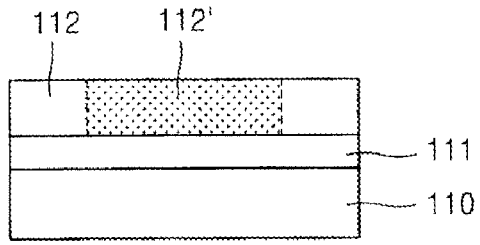
FIGS. 5A to 5C are sectional views illustrating a sequential crystallization process according to a related art.
Figure 5B:
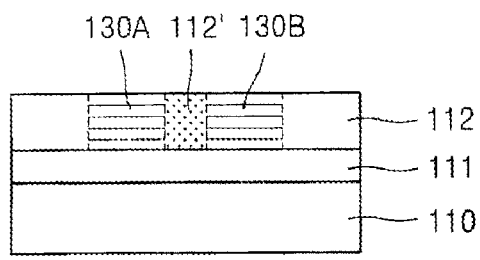
Figure 5C:
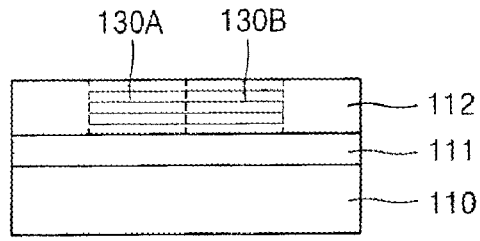
Figure 6A:
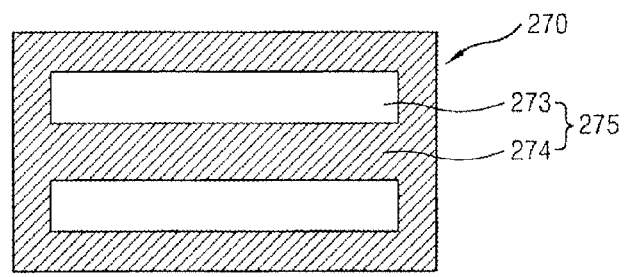
FIG. 6A is a plan view illustrating an example of a laser mask used for a sequential lateral solidification (SLS)

FIG. 6A is a plan view illustrating an example of a laser mask used for a sequential lateral solidification (SLS), which is designed to shorten crystallization time compared to the related art. Referring to FIG. 6A, a laser mask 270 includes a slit type pattern 275 having a rectangular transmitting region 273 with a predetermined width and length. The laser mask 270 includes two rectangular transmitting regions 273 for transmitting light and blocking region 274 for blocking light. A laser beam transmitted through the transmitting regions 273 of the slit 275 crystallizes a silicon thin film according to the shape (e.g., rectangular shape) of the transmitting regions 273.

Figure 6B:
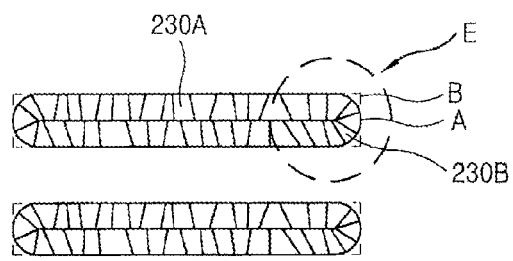
FIG. 6B is a plan view illustrating a silicon thin film crystallized by the mask of FIG. 6A.

Referring to FIG. 6B, however, an edge portion (E) of the crystallized silicon thin film has a round shape different from the mask pattern (the slit 275), due to the diffraction of the laser beam. This will now be described in detail. For reference, the dotted line at the edge portion (E) of the crystallized silicon thin film shown in FIG. 6B illustrates the shape of the slit 275 of the mask 270 used for the crystallization.

Figure 7:
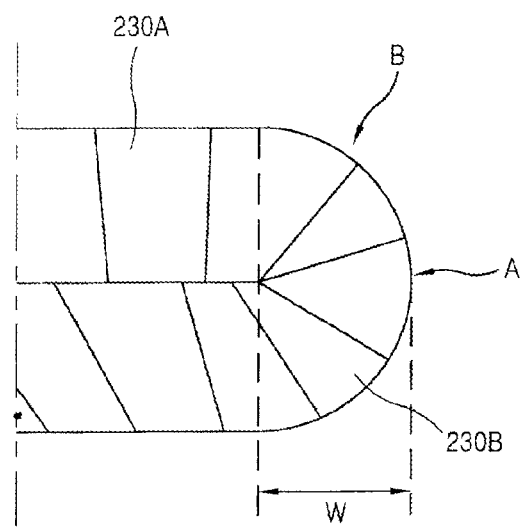
FIG. 7 is an enlarged plan view illustrating the portion 'E' of the crystallized silicon thin film of FIG. 6B.

FIG. 7 is an enlarged plan view illustrating the portion 'E' of the crystallized silicon thin film of FIG. 6B. As shown in FIG. 7, a region 'A', the center of the edge portion (E) has a similar crystallization pattern to the slit 275, because the laser beam having an energy density sufficient to completely melt the silicon film is irradiated. However, the laser beam is diffracted at a region 'B', corners of the edge portion (E) of the slit 275. Thus, the laser beam cannot have an energy density sufficient to completely melt the silicon thin film. As a result, the edge portion (E) becomes to have a convex or round shape. In other words, because the grains in the edge portion (E) of the crystallized silicon thin film having the round shape is grown from nuclei formed near the amorphous silicon thin film (solid phase) at the interface of the melted amorphous silicon, a second grain 230B grows in a direction different from a first grain 230A. That is, the second grain 230B has different crystallization characteristics from the first grain 230A, and as a result, a discontinuous region exists in the crystallized silicon thin film. At this time, because the discontinuous region having a width (W), the convex edge portion (E) of the crystallized silicon thin film, has different crystallization characteristics, the width (W) of the discontinuous region needs to be reduced in order to apply the silicon thin film to an LCD device.

Figure 8A:
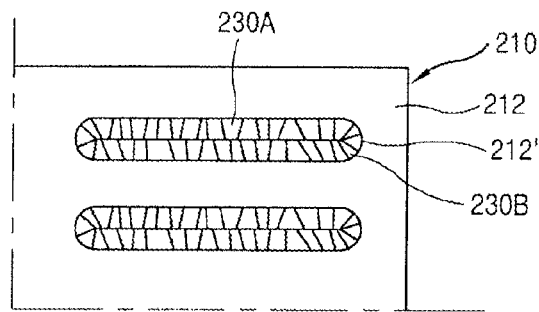
FIGS. 8A to 8C are plan views illustrating a sequential process for crystallizing a silicon thin film using the mask of FIG. 6A.
Figure 8B:
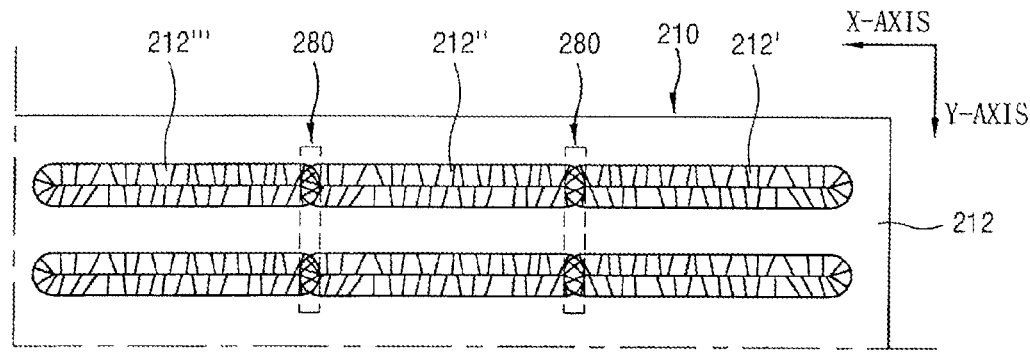
Figure 8C:
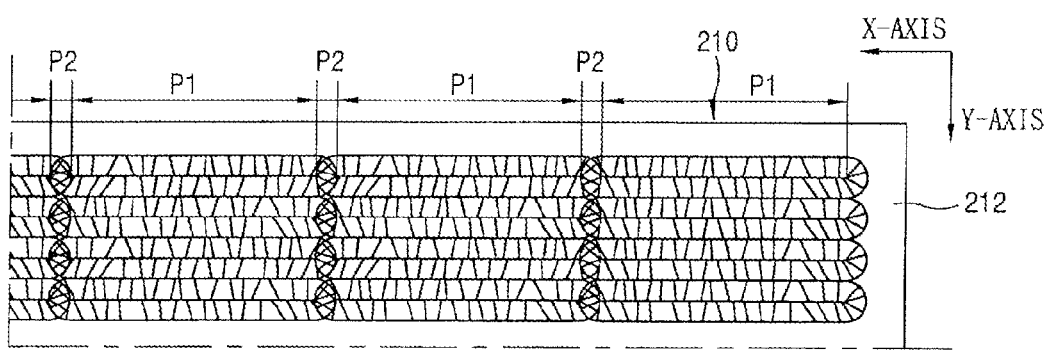

A crystallization process for crystallizing the silicon thin film using the above-described mask will now be described. FIGS. 8A to 8C are plan views illustrating a sequential process for crystallizing a silicon thin film using the mask of FIG. 6A.

First, as shown in FIG. 8A, the mask 270 of FIG. 6A is positioned on a substrate 210 to which a first laser beam is irradiated to crystallize an amorphous silicon thin film 212 formed on the substrate 210. At this time, the crystallized region corresponds to the transmitting region 273 of the mask 270, and when the mask 270 has two transmitting regions, the crystallized region has two crystallized regions having a predetermined length in a horizontal direction. In other words, when the first laser beam is irradiated on the surface of the substrate 210 using the mask 270 including the rectangular slit 275, the silicon thin film, to which the first laser beam has been irradiated through the slit 275, has a first grain 230A grown laterally (vertically in FIG. 8A) from nuclei formed near the amorphous silicon thin film 212 (solid phase) positioned at the upper and lower boundary surfaces. At this time, as mentioned above, the edge portions of the crystallized silicon thin film 212' have a round shape different from the mask pattern, the shape of the slit 275, due to the diffraction of the laser beam, and at the rounded edge portions (E), a second grain 230B grows from nuclei formed near the amorphous silicon thin film 212 (solid phase) positioned at the boundary surface of the melt amorphous silicon in a direction different from the first grain 230A. That is, the second grain 230B has crystallization characteristics different from the first grain 230A, and a discontinuous region exists in the crystallized silicon thin film.

After the first crystallization is completed, the stage (not shown) or the mask 270 placed over the substrate 210 is moved by a short distance not greater than the horizontal length of the pattern of the mask 270 (the width of the slit 275), and then a second laser beam is irradiated to proceed with the crystallization process in the direction of 'X' axis. For example, after the stage is moved in the direction of '−X' axis to overlap the discontinuous region 280 of the slit pattern-crystallized silicon thin film 212', the second laser beam is then irradiated on the surface of the substrate 210.

Then, as shown in FIG. 8B, the second crystallized pattern 212" having the same pattern as the silicon thin film 212' crystallized by the first crystallization is formed in the direction of 'X' axis, while overlapping the discontinuous region 280 of the first crystallized silicon thin film 212'. Thereafter, when a third laser beam is irradiated on the surface of the substrate 210 in the same manner as described with respect to the first laser beam, the third crystallization pattern 212''' having the same pattern as the silicon thin film 212" crystallized by the second crystallization is formed, while overlapping the discontinuous region 280 of the second crystallized silicon thin film 212". At this time, the wider the discontinuous region 280, the wider the overlap region of the laser beam for the next shot, which increases the overall process time. The discontinuous regions 280 of the crystallized silicon thin films 212', 212" and 212''' have different crystallization characteristics, and in this respect, because the silicon thin film 212 around the discontinuous regions 280 remains in an amorphous state, without being crystallized, the next shot of the laser beam is required to overlap these discontinuous regions 280.

After the crystallization process in the direction of 'X' axis is completed, the mask 270 or the stage is moved by a predetermined distance in the direction of 'Y' axis (in case of moving the stage, it is moved in the direction of '−Y' axis). And then, as shown in FIG. 8C, the laser irradiation process is performed again in the direction of 'X' axis, starting from the point where the first crystallization process is finished.

When the above-described crystallization process is repeatedly performed, a problem arises in that the polycrystalline silicon thin film has a plurality of first regions (P1) having normal grains and a plurality of second regions (P2) having the discontinuous regions, which have different crystallization characteristics and are located between the first regions P1. That is, when an LCD device is fabricated by incorporating such a silicon thin film having these discontinuous regions, the LCD device suffers from uneven characteristics, and thus, the quality of the LCD device becomes degraded. In addition, because the silicon thin film around the discontinuous regions remains in an amorphous silicon state, rather than having been crystallized, the next shot of the laser beam is required to overlap these discontinuous regions 280. These overlap regions (namely, X-overlap regions) in which the discontinuous regions overlap each other produce a shot mark. The shot mark decreases picture quality and produces non-uniform device characteristics, when it is applied to an LCD device or an organic light emitting diode.

Meanwhile, although not explained in the above crystallization process, the grains can be extended in the direction of 'Y' axis and the mask overlaps in the direction of 'Y' axis in order to increase the size of the grains, and then, the crystallization can be repeatedly performed. In this case, however, the shot mark may be produced in the overlap regions (namely, Y-overlap regions) in the direction of 'Y' axis.

The shot mark is also a critical matter when a laser mask 370 of a single scan method is employed, which is shown in FIG. 9, as well as when the above-described transition method (multiple scan method) is employed. That is, the shot mark problem needs to be solved in every crystallization method where the laser beam overlaps. Thus, the present invention discloses a laser mask and a crystallization method using the same that do not form such an overlap region in a crystallized silicon film. To this end, a laser mask according to the present invention has periodic patterns.

A laser mask according to the present invention is divided into four blocks, each block having a periodic pattern. A laser beam is irradiated onto a silicon thin film four times, each time using one of the four blocks ("four-shot crystallization method" or "four-shot method"). A silicon thin film crystallized by the above mentioned method has uniform crystallization characteristics without having an X-overlap or Y-overlap region, due to the periodic patterns of the mask. The crystallized silicon thin film formed by the periodic mask patterns and the four-shot method has uniform grains, which are grown radially, without having a shot mark, which will now be described in detail.

Figure 9A:
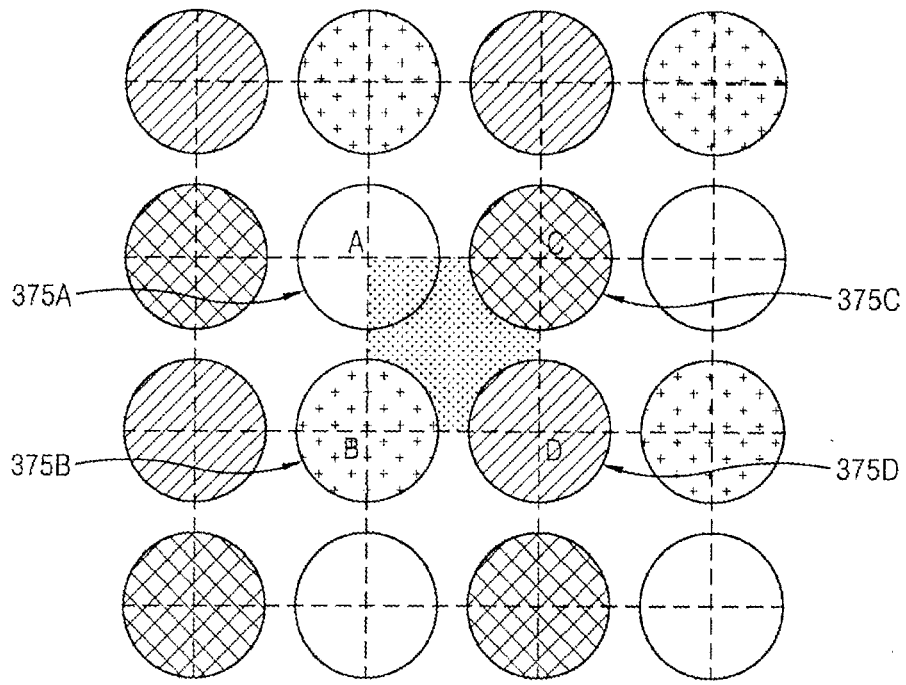
FIG. 9A illustrates a method for constructing periodic patterns in a laser mask according to the present invention.
Figure 9B:
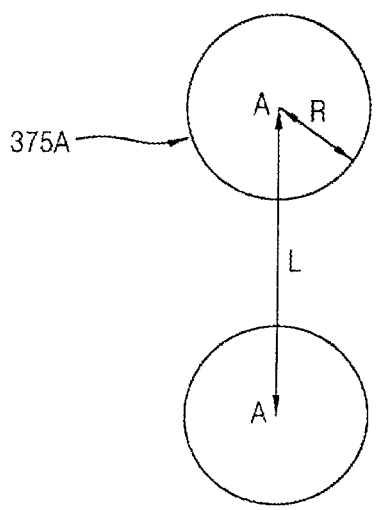
FIG. 9B is a schematic view illustrating the size and distance between the transmitting regions of FIG. 9A.

First, a method for constructing such periodic patterns in a laser mask will now be described. FIGS. 9A and 9B illustrate a method for constructing periodic patterns in a laser mask according to the present invention. The laser mask has four blocks, each block having its own periodic pattern.

Referring to FIG. 9A, a laser mask according to the present invention includes a plurality of transmitting regions having a circular shape. The laser mask is divided into four blocks to solve the shot mark problem. A transmitting region 375A with a position 'A' is formed in a first block, and a transmitting region 375B with a position 'B', a transmitting region 375C with a position 'C' or a transmitting region 375D with a position 'D' is formed in a second block. A transmitting region different the transmitting regions in the first and second block is formed in a third block. In other words, when the transmitting regions with the positions 'A' and 'B' are formed in the first and second blocks, the transmitting region with the position 'C' or 'D' is formed in the third block. A transmitting region different from the transmitting regions in the first to third blocks are formed in a fourth block. In other words, when the third block has the transmitting region with the position 'C', the fourth block has the transmitting region with the position 'D', while when the third block has the transmitting region with the position 'D', the fourth block has the transmitting region with the position 'C'.

In FIG. 9A, with respect to the mask pattern 375A having the transmitting region with the position 'A' (hereinafter referred to as a "reference point"), the mask patterns 375B, 375C and 375D are positioned in the laser mask counterclockwise. However, the present invention is not limited thereto, and a laser mask according to an embodiment of the present invention has four blocks, each block having one of the four mask patterns 375A, 375B, 375C and 375D.

In such an arrangement illustrated in FIG. 9A, when the four transmitting regions of the four mask patterns 375A to 375D are projected in one block, they form an equilateral rectangle. With respect to the reference point, the transmitting regions of the two mask patterns 375B and 375C are positioned at a first adjacent region (namely, four regions closest to the reference point 375A), and the transmitting region of the fourth mask pattern 375D with the position 'D' is positioned at a second adjacent region in the diagonal direction of the rectangle. In other words, the transmitting region of the mask pattern 375A formed in the first block is positioned at one vertex of the rectangle, and the transmitting regions of the other patterns 375B to 375D are positioned at the other three vertexes of the rectangle, as illustrated in FIG. 9A.

Meanwhile, the size and intervals of the four periodic patterns 375A to 375D should satisfy a certain relationship in order for the laser mask to completely crystallize amorphous silicon by irradiating four times (four-shot method) without a shot mark. This will now be described.

FIG. 9B is a schematic view illustrating the size and distance between the transmitting regions of FIG. 9A, taking an example of the transmitting region of the position 'A'. As illustrated, assuming that a radius of the transmitting region 475A of the position 'A' is 'R' and a distance between the centers of the transmitting regions 475A is 'L', the radius (R) of the transmitting region should satisfy equation (1) in order to crystallize the overall region of an amorphous silicon film.

$$\frac{L}{2\sqrt{2}} \le R < \frac{L}{2} \quad \text{equation (1)}$$

If the radius (R) of the transmitting regions of the mask patterns (375A to 375D) is smaller than $L/2\sqrt{2}$, the overall region cannot be crystallized by the four-shot method, and if the radius (R) is greater than L/2, then the mask patterns (375A to 375D) contact each other.

Figure 10:
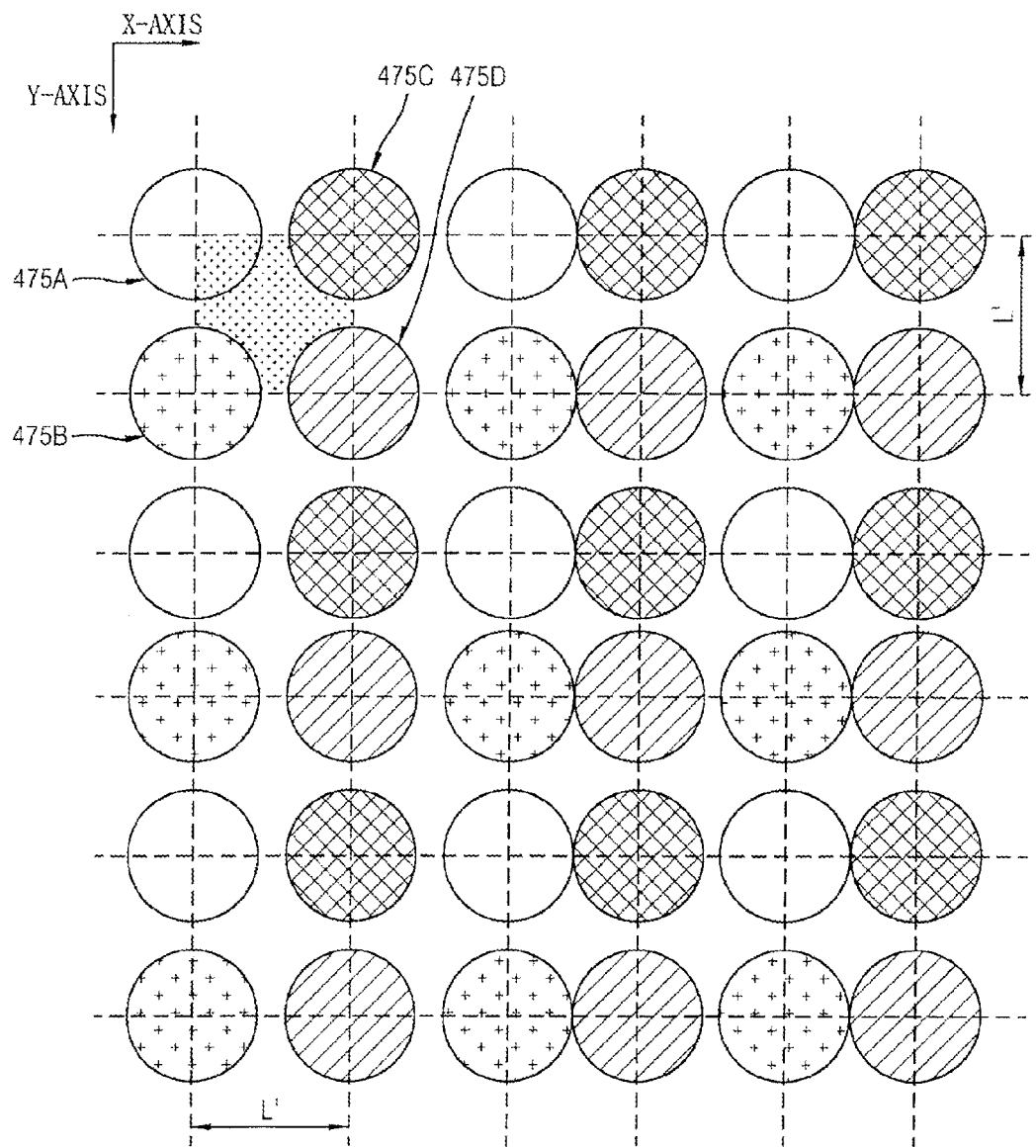
FIG. 10 illustrates a method for constructing a laser mask having four blocks, each block having one of the mask patterns of FIG. 9A.

A laser mask having the four mask patterns in four blocks will now be described in detail. FIG. 10 illustrates a method for constructing a laser mask having four blocks, each block having one of the mask patterns of FIG. 9A.

As illustrated, mask patterns 475A to 475D are arranged in a 6 rows×6 columns matrix configuration, forming equilateral rectangles as discussed in FIG. 9A. In the first row, the transmitting regions of the mask pattern 475A of the position 'A' and the mask pattern 475C of the position 'C' are repeatedly and alternately positioned in the direction of the 'X' axis, starting from the transmitting region of the mask pattern 475A of the position 'A'. For the second row, after being moved in the direction the 'Y' axis by a distance corresponding to the length (L') of the side of the equilateral rectangle in the mask patterns 475A and 475C in the first row, the transmitting regions of the mask patterns 475B and 475D are repeatedly and alternately positioned. In other words, in the second row, after being moved by L' in the direction of Y axis, the transmitting regions of the mask pattern 575B of the position 'B' and the mask pattern 575D of the position 'D' are repeatedly positioned in the direction of X axis. The first and third rows (i.e., the odd number rows) have the same construction, and the second and fourth rows (i.e., the even number rows) have the same construction.

Meanwhile, in the first column, the transmitting regions of the mask patterns 475A and 475B are repeatedly and alternately positioned, starting from the transmitting region of the mask pattern 475A of the position 'A'. In the even number columns, the transmitting regions of the mask patterns 475C and 475D are repeatedly and alternately positioned, and in this case, the even number columns are moved by as long as L' (as long as the length of the side of the equilateral rectangle) in the direction of X axis from the odd number columns. The first and third columns (i.e., the odd number columns) have the same construction, and the second and fourth columns (i.e., the even number columns) have the same construction.

By positioning the four periodic mask patterns in four blocks in a laser mask and applying the laser mask to the four-shot crystallization method, a crystalline silicon thin film can be obtained without an X-overlap or a Y-overlap. This will now be described in more detail.

FIGS. 11A to 11D illustrate four blocks of a laser mask constructed according to the method described in FIG. 10.

In the laser mask, the mask pattern 475A of the position 'A' is formed in the first block 480', the mask pattern 575B of the position 'B' is formed in the second block 480", the mask pattern 475C of the position 'C' is formed in the third block 480''', and the mask pattern 475D of the position 'D' is formed in the fourth block 480''''. This positioning method is merely one example of the present invention, and a silicon thin film can be crystallized without a shot mark by the four-shot crystallization method using such a mask.

Each block (480' to 480'''') includes a plurality of circular transmitting regions and a blocking region of one of the mask patterns 473A to 473D. The first block 480' includes the transmitting regions of the mask pattern 475A of the position 'A' positioned in the (2N−1) (N=1, 2, 3) rows×(2N−1) columns of FIG. 10. The second block 480'' includes the transmitting regions of the mask pattern 475B of the position 'B' positioned in the (2N) rows ×(2N−1) columns. The third block 580''' includes the transmitting regions of the mask pattern 575C of the position 'C' positioned in the (2N−1) rows×(2N) columns. The fourth block 480''''includes the transmitting regions of the mask patterns 475D of the position 'D' positioned in the 2N rows×2N columns.

Although the transmitting regions of the mask patterns 575A to 575C have a circular shape in the drawings, they can be also formed to have a regular polygon shape such as regular triangle, square, regular hexagon and regular octagon without being limited thereto. In addition, in the drawings, although the radius (R) of the circular mask patterns 475A to 475D is $L/2\sqrt{2}$, it is not limited thereto, so long as the relationship between R and L satisfies equation 1.

FIGS. 12A to 12D illustrate a process for crystallizing a silicon thin film using the laser mask described in FIGS. 11A to 11D. A silicon thin film crystallized with the four-block laser mask described above has uniform crystallization characteristics without a shot mark.

Figure 12A:
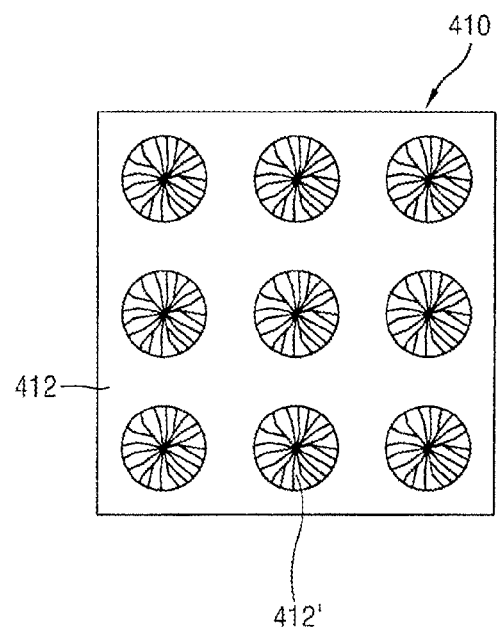
FIGS. 12A to 12D illustrate a process for crystallizing a silicon thin film using the laser mask described in FIGS. 11A to 11D.

First, as shown in FIG. 12A, when a first laser beam is irradiated onto a silicon film 412 on a substrate 410 through the mask pattern 475A of the position 'A' (namely, the transmitting regions 473A of the mask pattern 475A) formed in the first block 480, grains grow toward the centers of the circular pattern 475A using the amorphous silicon thin film (solid phase) 412 positioned at the boundary surface as a nucleus, thereby forming first polycrystalline crystals 412' having a circular shape. The regions crystallized by this first crystallization correspond to the transmitting regions 473A of the laser mask. Thus, if there are nine transmitting regions in the first block of the laser mask, nine polycrystalline crystals 412' having a circular shape will be formed in the silicon thin film 412.

Figure 11A:
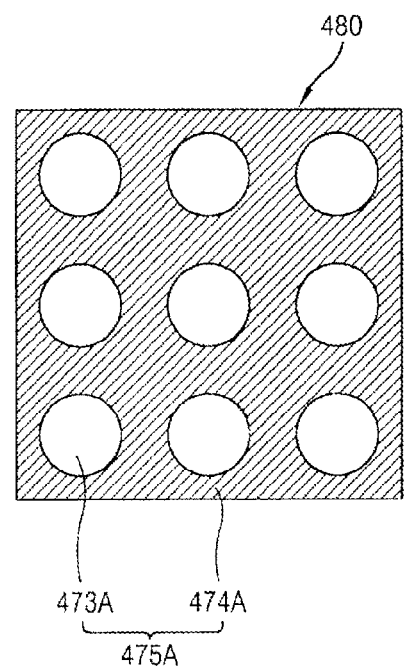
FIGS. 11A to 11D illustrate four-block laser mask constructed according to the method described in FIG. 10.
Figure 11B:
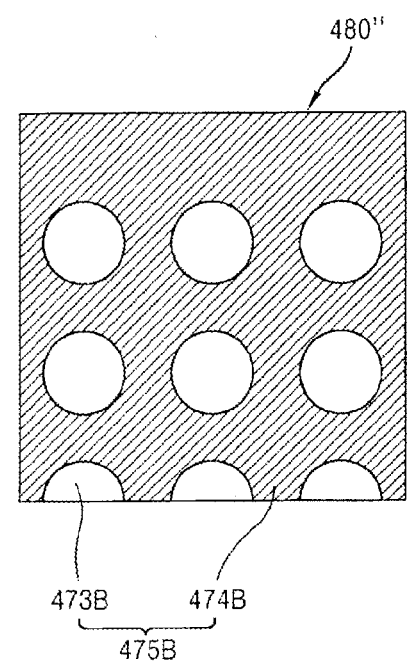
Figure 11C:
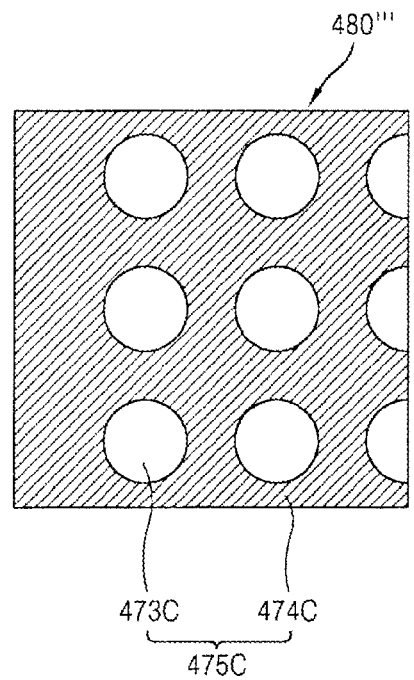
Figure 11D:
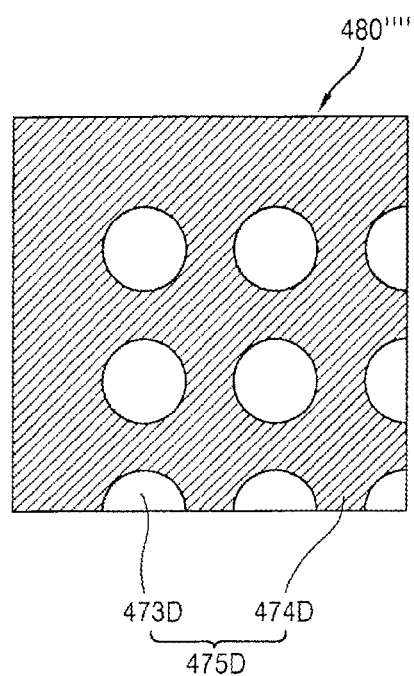
Figure 12B:
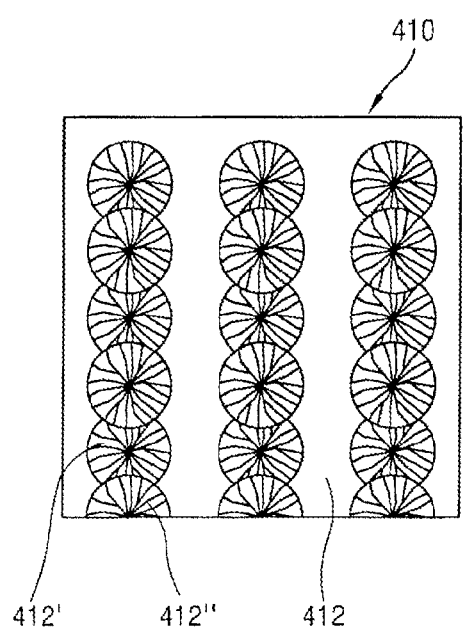

After the first crystallization is completed, a second laser beam is irradiated onto the silicon thin film 412' having the first polycrystalline crystals through the second block 480'' of FIG. 11B. This second crystallization uses the second block 480'', in which the mask pattern 475B of the position 'B' is formed, without moving the substrate in the direction X or Y. As a result, as shown in FIG. 12B, grains grow toward the centers of the mask pattern 475B of the second block 480'' to form the second polycrystalline crystals 412'', starting from the circumferences of the first polycrystalline crystals 412'. The second crystallization is such that two of the first crystals 412' are positioned at lower and upper sides of the second crystal 412'', and that the second crystallization starts from the regions in which the mask pattern 475B of the position 'B' overlaps the two first crystals 412'. As a result, the second crystals 412'' grow toward the centers of the mask pattern 475B of the position 'B'.

Figure 12C:
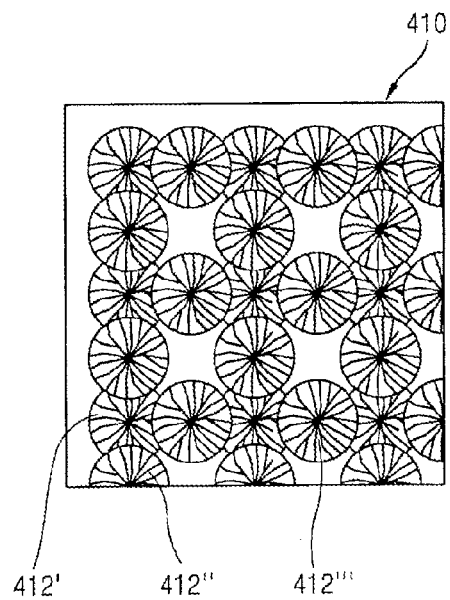

Next, a third laser beam is irradiated onto the silicon thin film 412 having the first and second crystals 412' and 412'' through the third block 480''', in which the mask pattern 475C of the position 'C' is formed. Then, as shown in FIG. 12C, grains grow toward the centers of the mask pattern 475C of the third block 480''' to form the third polycrystalline crystals 412''', starting from the circumferences of the silicon thin film 412' crystallized by the first crystallization. The third crystallization is such that the first crystals 412' is positioned at left and right sides of the third crystal 412''', and that the third crystallization starts from the regions in which two first crystals 412' overlap the mask pattern 475C of the position 'C' by the third shot. As a result, the third crystals 412''' are formed toward the centers of the mask pattern 475C of the position 'C'. In this manner, the second and third crystals 412'' and 412''' are grown toward the centers of the mask patterns 475B and 475C using the first crystals 412' crystallized by the first crystallization as a nucleus. If the size or radius of the transmitting regions of the mask patterns 475A to 475D is greater than a specific size, the third crystals 412''' formed by the third shot overlap part of the second crystals 412'' as well as part of the first crystals 412'. Even in this case, however, the grains of the third crystals 412''' grow toward the centers of the mask pattern 475C of the position 'C' using the first crystals 412' crystallized by the first crystallization and the second crystals 412'' crystallized by the second crystallization as a nucleus.

Figure 12D:
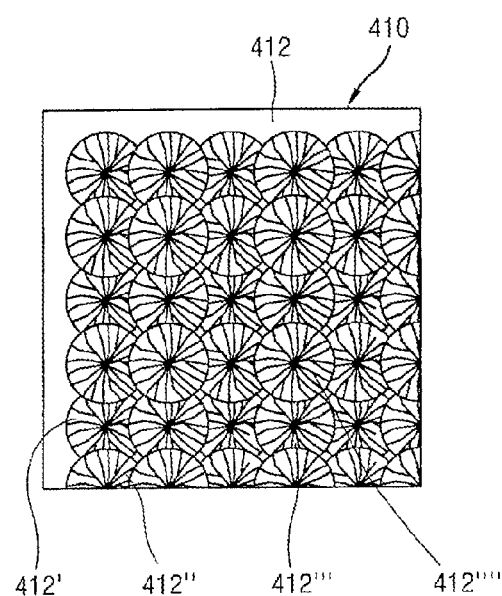

Finally, a fourth laser beam is irradiated onto the silicon thin film having the first to third polycrystalline crystals 412' to 412''' through the fourth block 480'''', in which the mask pattern 475D of the position 'D' is formed. Then, as shown in FIG. 12D, grains grow toward the centers of the mask pattern 475D of the fourth block 480'''' to form the fourth polycrystalline crystals 412'''', starting from the circumferences of the second crystals 412'' crystallized by the second crystallization and the third crystals 412''' crystallized by the third crystallization. In this manner, the four-shot method completely crystallizes the silicon film on the substrate 410 using the laser mask without an X-overlap or a Y-overlap, that is, without a shot mark.

As explained, the laser mask has four blocks, each block having a periodic pattern. At this time, the first to fourth crystals 412' to 412'''' formed by the four-shot method have the same circular shape as the mask patterns 475A to 475D. Accordingly, the crystallized silicon thin film has uniform grains, which are grown radially.

Figure 13A:
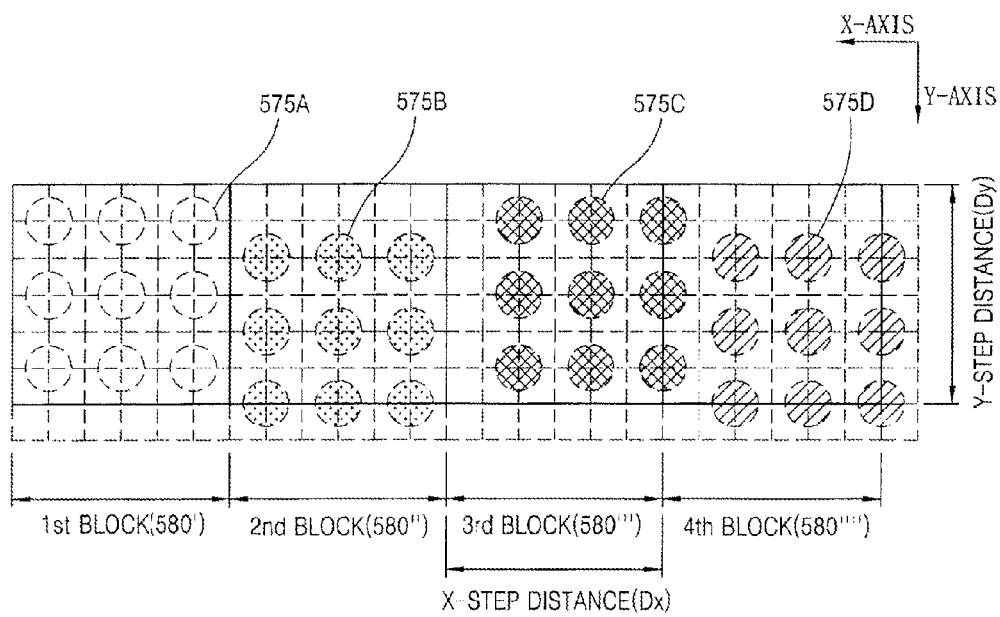
FIG. 13A illustrates a method for constructing a laser mask according to an embodiment of the present invention.

A laser mask and a process for crystallizing a large-size silicon thin film using the same according to the present invention will now be described. FIG. 13A illustrates a method for constructing a laser mask according to an embodiment of the present invention.

Referring to FIG. 13A, a mask pattern 575A of the position 'A' is formed in a first block 580' indicated by a square solid line, a mask pattern 575B of the position 'B' is formed in a second block 580'', a mask pattern 575C of the position 'C' is formed in a third block 580''', and a mask pattern 575D of the position 'D' is formed in a fourth block 580''''. The four mask patterns 575A to 575D are formed in the four blocks 580' to 580'''' of the laser mask according to the pattern constructing method described in FIG. 9A or FIG. 10.

In the first block 580', nine transmitting regions (the mask pattern 575A of the position of 'A') having a circular shape are arranged in a 3 rows×3 columns matrix configuration. In the second block 580", the transmitting regions of the mask pattern 575B of the position 'B' are formed after being moved downward by a distance equal to one side of the equilateral rectangle (namely, the small equilateral rectangle indicated by a dotted line) with respect to the pattern 575A of the position 'A' of the first block 580'. Like the mask pattern 575A of the position 'A', a total of nine transmitting regions of the mask pattern 575B are formed in a 3 rows×3 columns matrix configuration. In the third block, the transmitting regions of the mask pattern 575C of the position 'C' are formed after being moved rightward by a distance equal to one side of the equilateral rectangle with respect to the pattern 575A of the position 'A' formed in the first block 580'. Nine transmitting regions of the mask pattern 575C of the position 'C' are formed in a 3 rows×3 columns matrix configuration. Finally, in the fourth block, the transmitting regions of the mask pattern 575D of the position 'D' are formed after being moved rightward and downward by a distance equal to one side of the equilateral rectangular shape with respect to the pattern 575A of the position 'A' formed in the first block 580'. Nine transmitting regions of the mask pattern 575D are formed in a 3 rows×3 columns matrix configuration.

The positions of the transmitting regions of the mask patterns 575A to 575D correspond to the positions of the rectangles indicated by a dotted line in the first block 580'. With respect to the pattern 575A position in the N rows×M columns of the first block 580', the mask pattern 575B of the position 'B' positioned in the N rows×M columns of the second block 580" is shifted by the length of one side of the equilateral rectangle in the direction of Y axis, the mask pattern 575C of the position 'C' positioned in the N rows×M columns of the third block 580'" is shifted rightward (namely, −X axis) by the length of one side of the equilateral rectangle, and the mask pattern 575D of the position 'D' positioned in the N rows×M columns of the fourth block 580"" is shifted by the length of one side of the equilateral rectangle in the directions of −X and Y axes. In other words, if the mask patterns 575B to 575D are formed in the first block 580', the mask patterns 575B to 575D are shifted by a predetermined distance (namely, the length of one side of the equilateral rectangle) from the mask pattern 575A in the direction of X axis, Y axis and X and Y axes.

In the drawing, the mask patterns 575A to 575D are also formed outside the four blocks 580' to 580"" indicated by the solid line. The four blocks 580' to 580"" are virtual regions for constructing the periodic patterns 575A to 575D on a laser mask, and thus the mask patterns 575A to 575D can be rearranged in accordance with process conditions such as a laser equipment and an optical system.

The blocks 580' to 580"" can be used as a reference for the next shot during the four-shot crystallization method. According to this, a moving distance in the direction of X axis (X-step distance (Dx)) is substantially the same as the length of the horizontal side of the square (one block), and a moving distance in the direction of Y axis (Y-step distance (Dy)) is substantially the same as the length of the vertical side of the square. The X-step distance (Dx) means a moving distance of the laser mask or the stage in the direction of X axis for the four-shot method, and the Y-step distance (Dy) means a moving distance of the laser mask or the stage in the direction of Y axis to proceed with the Y-axis crystallization after the X-axis crystallization. The Y-step distance (Dy) also means a moving distance of the mask or the stage in the Y-axis direction so that a lower region of the silicon thin film, which is not irradiated by the four-shot laser beam during the X-axis crystallization, can be crystallized by the four-shot method. The X-step distance (Dx) and the Y-step distance (Dy) are determined in consideration of the periodicity of the four blocks 580' to 580"" in order to remove an X-overlap or a Y-overlap.

Figure 13B:
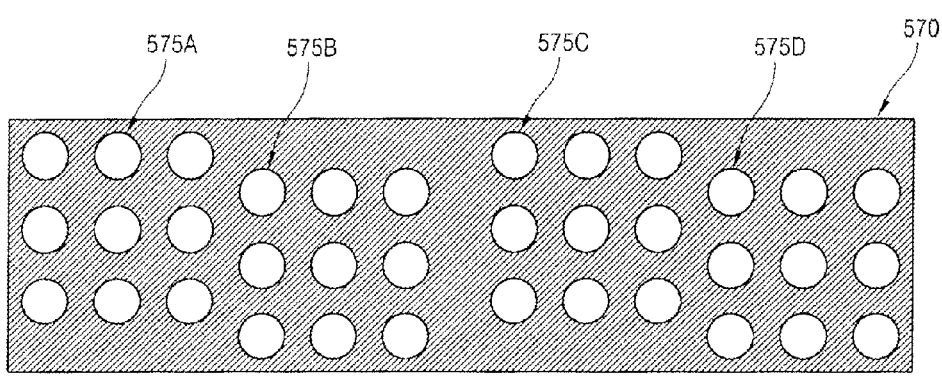
FIG. 13B illustrates an example of a laser mask fabricated by the pattern constructing method described with reference to FIG. 13A.

A laser mask having the four mask patterns described above will now be described with an example. FIG. 13B illustrates an example of a laser mask fabricated by the pattern constructing method described with reference to FIG. 13A.

As described above, a laser mask 570 formed by the mask constructing method in accordance with an embodiment of the present invention has four blocks with the mask pattern 575A of the position 'A', the mask pattern 575B of the position 'B', the mask pattern 575C of the position 'C' and the mask pattern 575D of the position 'D'. The laser mask 570 blocks a laser beam except for the transmitting regions of the mask patterns 575A to 575D formed with a certain periodicity. The mask 570 can be made of metal that can block light, such as chrome, aluminum, or the like. Although nine transmitting regions are formed in each block of the laser mask 570, more than nine transmitting regions can be formed in each block in consideration of process conditions such as laser equipment or optical system.

A process for crystallizing a large-size silicon thin film using the laser mask described above will now be described. FIGS. 14A to 14G illustrate a sequential process for crystallizing a silicon thin film using the laser mask illustrated in FIG. 13B.

As illustrated, four blocks are indicated by a solid line for convenience of explanation. Thus, each block is indicated by a square solid line. In this example, starting from left, a first block 580' corresponds to the mask pattern of the position 'A', a second block 580" corresponds to the mask pattern of the position 'B', a third block 580'" corresponds to the mask pattern of the position 'C', and a fourth block 580"" corresponds to the mask pattern of the position 'D'.

Figure 14A:
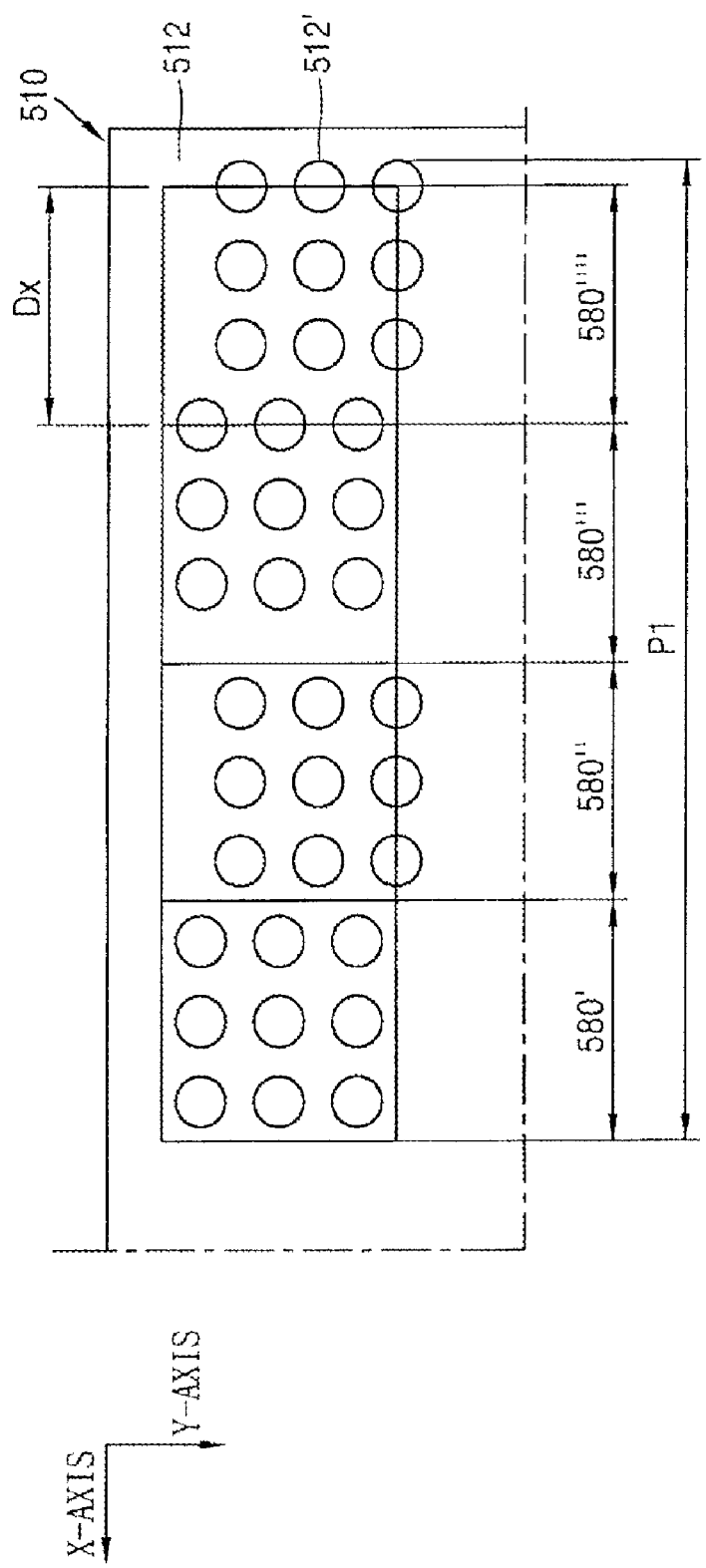

Referring to FIG. 14A, a first crystallization is performed by irradiating a laser beam onto a silicon film 512 deposited on a substrate 510 through the laser mask shown in FIG. 13B. At this time, the laser beam has an energy density corresponding to the complete melting region as described in the earlier section, and crystals grow toward the centers of the circles using the amorphous silicon (solid phase) thin film 512 positioned at the boundary surface as a nucleus, thereby forming first polycrystalline crystals 512' in a first irradiated region (P1). The first crystals 512' have radial grains. In this case, the entirety of the first irradiated region (P1) is not crystallized, but a plurality of first crystals 512' having a circular shape are formed according to the patterns on the mask 570. In detail, the regions crystallized by the first crystallization correspond to the transmitting regions of the mask 570. Thus, if the mask having the four blocks 580' to 580"" has thirty six transmitting regions, then the silicon film also has thirty six polycrystalline silicon crystals 512', each crystal having a predetermined radius.

Figure 14B:
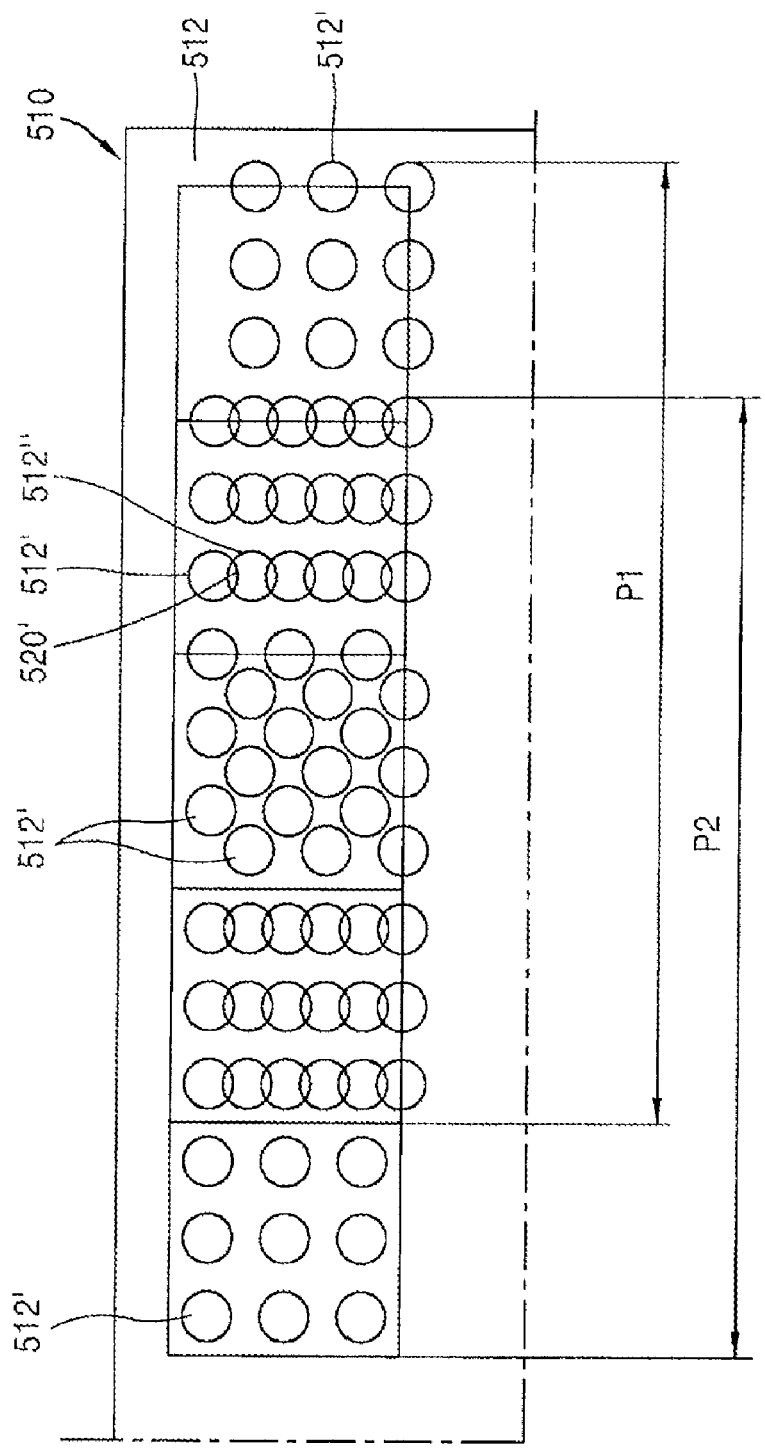

After the first crystallization is completed, the stage (not shown) on which the substrate is placed or the mask 570 is moved in the X-axis direction by a distance of the length of the side of the square (one block), which is the same as the X-step distance (Dx), and then a second laser beam is irradiated. For example, when the stage is moved by the X-step distance (Dx) in the "−X"-axis direction, the first crystals 512' of the position 'C' formed by the third block overlap the mask pattern of the position 'D' in the fourth block. Then, when a second laser beam is irradiated on the surface of the substrate, second crystals 512" having the same shape as the first crystals 512' are formed, as shown in FIG. 14B. At this time, the positions of the second crystals 512" are shifted by the X-step distance (Dx) with respect to the first crystals 512', and thus the second crystals 512" overlap a portion of the first crystals 512'.

The two center regions in FIG. 14B where the first laser shot and the second laser shot overlap each other, that is, where the first irradiated region (P1) and the second irradiated region (P2) overlap each other (except for the central region where the first irradiated region P1 and the second irradiated region P2 do not overlap each other in this case), are irradiated by the second-shot laser beam, so that starting from the circumferences of the first crystals 512', crystals grow toward the centers of the patterns of the mask 570 of the second shot to form the second polycrystalline crystals 512". In other words, the two first crystals 512', which have been crystallized through the first crystallization, are positioned upper and lower sides of the second crystals 512", and the second crystallization starts from the regions 520' where the mask pattern and the two first crystals 512' overlap each other, thereby forming the second crystals 512" grown toward the centers of the mask pattern (refer to FIG. 12B). In FIG. 14B, the crystals formed by the first block of the mask 570 during the second shot are the first crystals, not the second crystals.

Next, the stage or the mask 570 is moved again by the X-step distance (Dx) in the X-axis direction, and then a third laser beam is irradiated on to the silicon film 512. At this time, the first crystals 512' of the position 'B' formed by the second block overlap the mask pattern of the position 'D' in the fourth block. Then, as shown in FIG. 14C, third crystals 512''' having the same shape as the first crystals 512" are formed. The positions of the third crystals 512''' are shifted by the X-step distance (Dx) with respect to the first crystals 512', and thus overlap a portion of the first crystals 512' and the second crystals 512".

At this time, the two center regions in FIG. 14C where the first to third laser shots overlap each other, that is, where the first irradiated region (P1), the second irradiated region (P2) and the third irradiated region (P3) overlap each other, are irradiated by the third-shot laser beam, so that starting from the circumferences of the first and second crystals 512' and 512", the third crystals grow toward the centers of the patterns of the mask 570 to form the third polycrystalline crystals 512'''. In the left region of the two center regions, the first crystals 512' crystallized through the first crystallization are positioned at the left and right sides of the third crystal 512", and the third crystallization starts from the regions 520" where the mask pattern according to the third shot overlaps the two first crystals 512", thereby forming the third crystals 512''' grown toward the centers of the mask pattern (refer to FIG. 12C). In addition, in the right region of the two center regions, the four first crystals 512', which have been crystallized through the first and second crystallization, are positioned at the upper/lower and left/right sides of the third crystals 512''', and the third crystallization starts from the regions 520" where the mask pattern of the third shot and the four first crystals 512' overlap each other, thereby forming the third crystals 512''' grown toward the centers of the mask pattern.

Figure 14D:
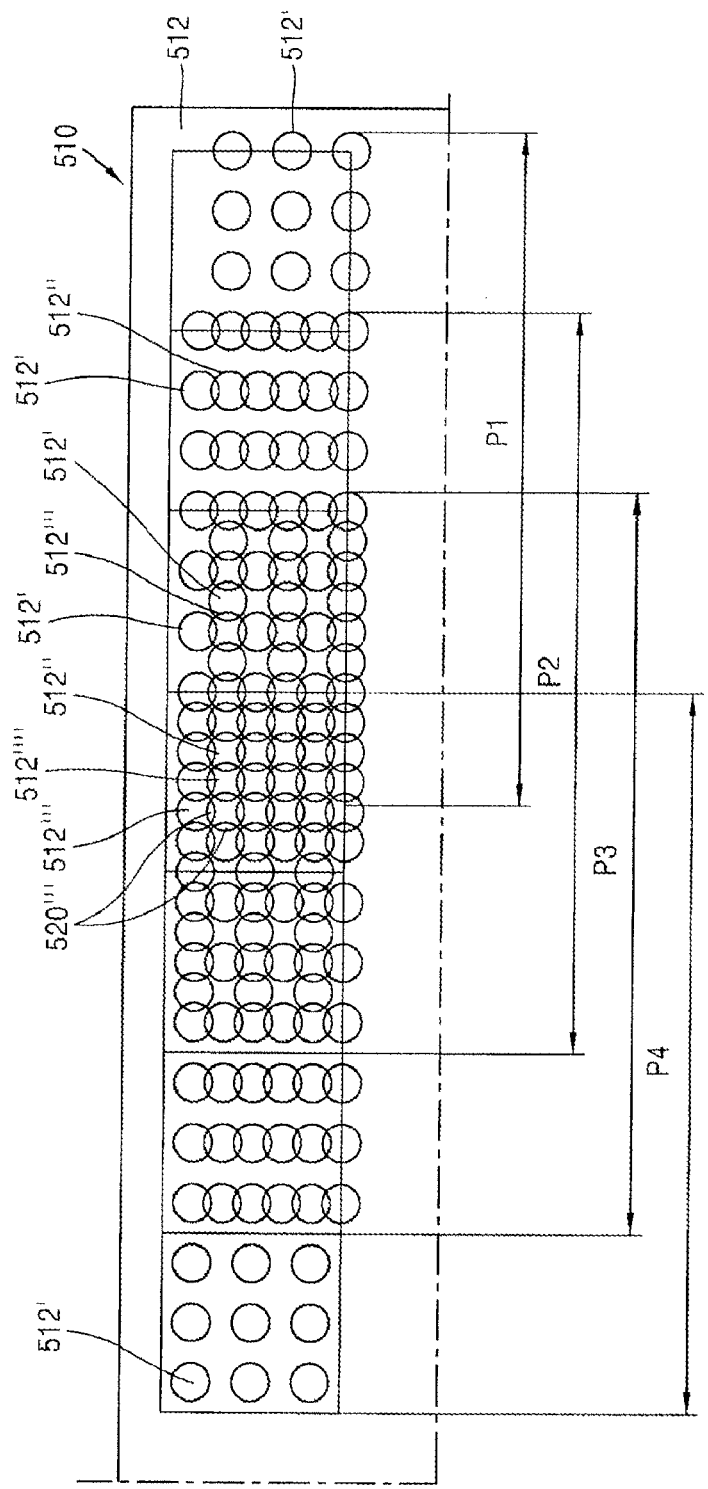

Subsequently, the stage or the mask 570 is moved again by the X-step distance (Dx) in the X-axis direction, and then a fourth laser beam is irradiated to continuously proceed with the crystallization in the X-axis direction. At this time, the first crystals 512' of the position 'A' formed by the first block overlap the mask pattern of the position 'D' in the fourth block. Then, as shown in FIG. 14D, fourth crystals 512'''' having the same shape as the first crystals 512' are formed. The positions of the fourth crystals 512'''' are shifted by the X-step distance (Dx) with respect to the first crystals 512', and thus overlap a portion of the first, second and third crystals 512', 512" and 512'''.

At this time, the center region where the first to fourth laser shots overlap each other, that is, where the first irradiated region (P1), the second irradiated region (P2), the third irradiated region (P3) and the fourth irradiated region (P4) overlap each other, is irradiated by the fourth-shot laser beam, so that starting from the circumferences of the second and third 512" and 512''' that have been crystallized by the second and third crystallizations, the fourth crystals grow toward the centers of the pattern of the mask 570 to form the fourth polycrystalline crystals 512''''. In other words, four of the second and third crystals 512" and 512''', which have been crystallized by the second and third crystallizations, are positioned at upper/lower and left/right sides of the fourth crystals 512'''', and the fourth crystallization starts from the regions 520''' where the mask pattern of the fourth shot overlaps the four second and third crystals 512" and 512''', thereby forming the fourth crystals 512'''' grown toward the centers of the mask pattern (refer to FIG. 12D).

In this manner, after irradiating a laser beam four times through the four-block laser mask in the X-axis direction, the portion of the silicon thin film that has been irradiated four times ("four-shot crystal region" or "four-shot region") is crystallized without an X-overlap, that is, without a shot mark, as shown in FIG. 14D. That is, the region where the first crystals 512', the second crystals 512", the third crystals 512''' and the fourth crystals 512'''' are all formed corresponds to the four-shot region, which has been crystallized without a shot mark.

Figure 14E:
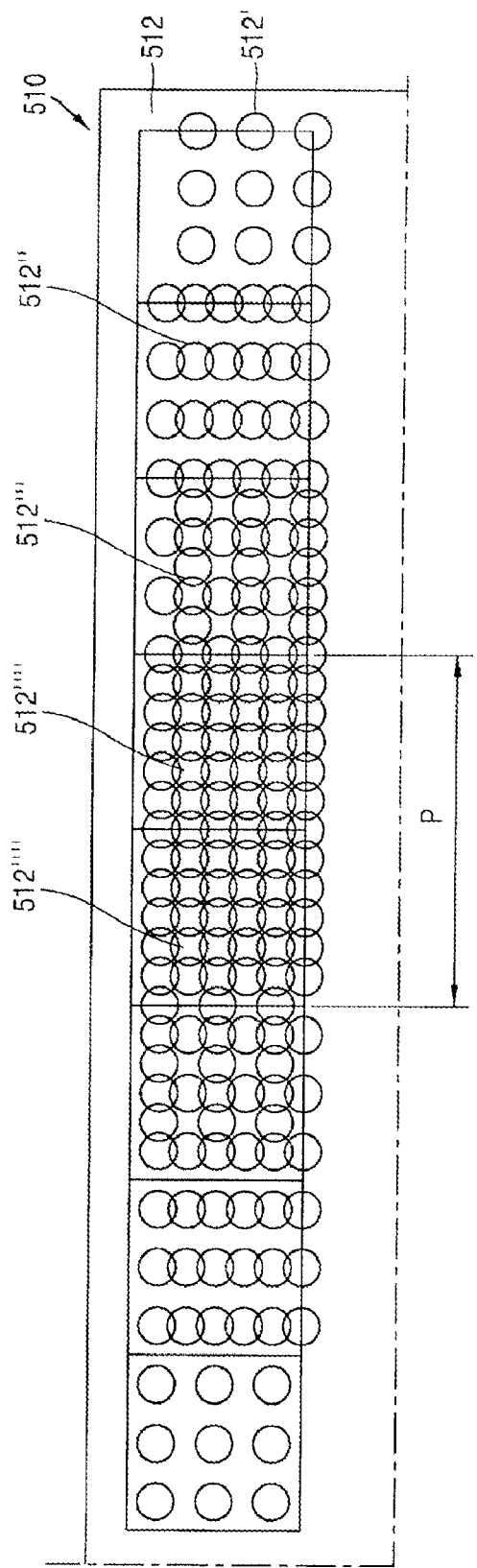

Meanwhile, the crystallization process is repeatedly performed in the X-axis direction. Then, as shown in FIGS. 14E and 14F, the four-shot crystal region (P) without a shot mark increases in the X-axis direction. This four-shot crystal region (P) is a uniform crystal region without a shot mark that is formed by the four-shot crystallization method using the laser mask having four blocks, each block having a periodic pattern.

Figure 14G:
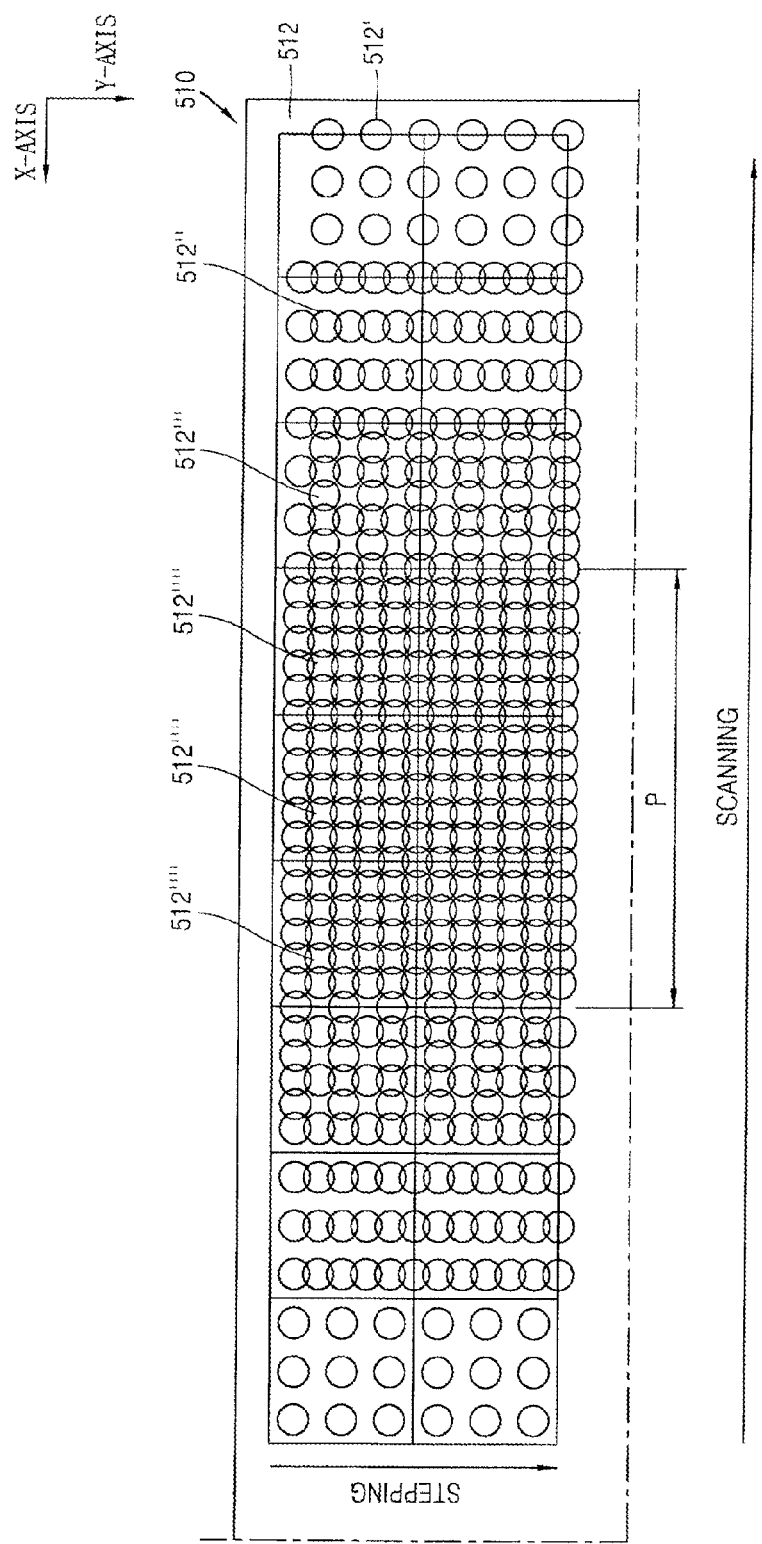

The lower region of the silicon film is not completely irradiated by a laser beam. This is because the crystallization process was performed only in the X-axis direction. After the crystallization process is completed in the X-axis direction ("X-axis crystallization"), the mask 570 or the stage is moved by the Y-step distance (Dy) in the Y-axis direction (in case of moving the stage, in the direction of −Y axis), and then, the crystallization process described above with respect to the X-axis crystallization is continuously performed in the direction of −X axis, starting from the end point where the first X-axis crystallization process is finished, which is illustrated in FIG. 14G.

In this case, the crystallization is continuously performed by applying the same blocks of the mask 570 as the X-axis crystallization. The upper pattern (namely, the pattern formed beyond the block region) of the mask 570 is positioned corresponding to the lower region which has not been completely irradiated by a laser beam after the first X-axis crystallization. Thus, the lower region can be completely crystallized by the crystallization process in the direction of the −X axis. With this procedure, the lower region crystallized by the crystallization process in the direction of the −X axis can be formed without a Y-overlap.

Thereafter, the above-described method is repeatedly applied in the directions of X axis and Y axis to form a desired size of polycrystalline silicon. In particular, the four-shot crystal region (P) is a crystallized region without an X-overlap or a Y-overlap that has uniform crystallization characteristics. This is because this region does not include a shot mark and/or the crystals have radial grains.

In this embodiment, a polycrystalline silicon thin film without an X-overlap or a Y-overlap is obtained by the four-shot crystallization method using the laser mask having four blocks, each block having a periodic pattern. Although the mask patterns have the transmitting regions having a circular shape, they also can be formed to have a shape of a regular polygon, such as regular triangle, square, regular hexagon, regular octagon, or the like. In addition, although each block has nine transmitting regions, the number of the transmitting regions in each block can be varied depending on process conditions.

Moreover, although the radius (R) of the transmitting regions is $L/2\sqrt{2}$, where L is the distance between the centers of the transmitting regions, it can be varied, as long as the relationship between R and L satisfies equation 1. In this embodiment, although the mask pattern of the position 'A', the mask pattern of the position 'B', the mask pattern of the position 'C' and the mask pattern of the position 'D' are positioned in order in the first to fourth blocks of the mask, the positions of the mask patterns can be varied. Furthermore, the four mask patterns can be formed in a different order, so long as a laser beam can be irradiated on the four mask patterns four times.

As described in the above embodiment of the present invention, laser beams are irradiated onto a silicon thin film through a laser mask having the four mask patterns formed in the four blocks of the laser mask. Accordingly, the portion of the silicon thin film irradiated by a laser beam four times is completely crystallized. The four-shot method includes the first crystallization by the first shot, the second crystallization by the second shot, the third crystallization by the third shot and the fourth crystallization by the fourth shot. In the first crystallization, crystals grow toward the centers of the patterns using the amorphous silicon thin film (solid phase) positioned around the circular pattern as a nucleus, which is at the boundary surface of the circumferences. In the second, third and fourth crystallizations, crystals grow toward the centers of the mask patterns of the second, third and fourth shots using the circumferences of the first, second and third crystals as a start point. In the third crystallization, crystals also can grow toward the centers of the mask pattern of the third shot using the circumferences of the crystals that have been crystallized by the first crystallization as a start point.

Figure 15:
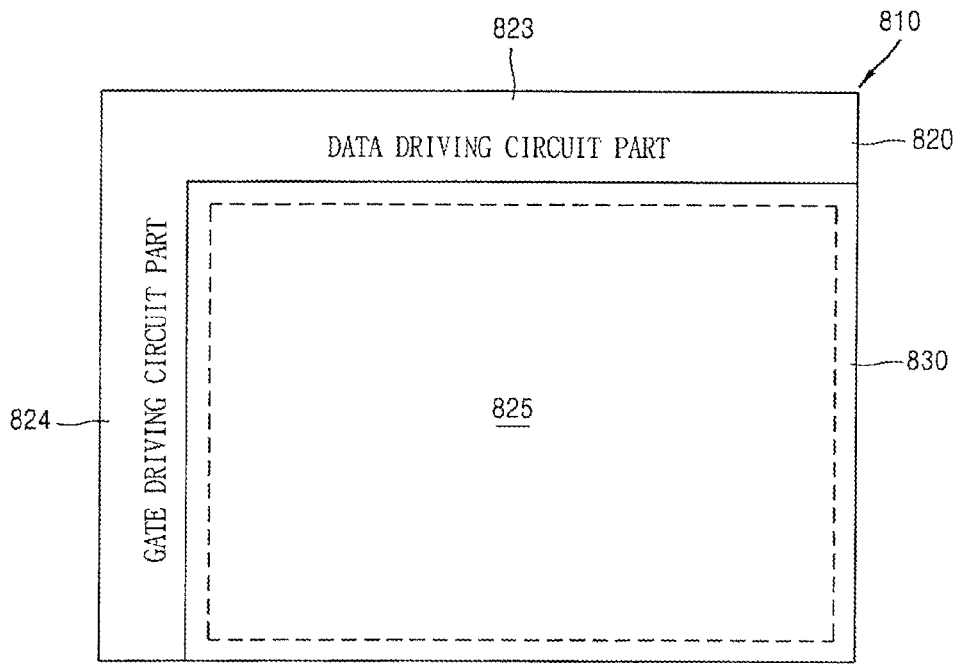
FIG. 15 is a plan view illustrating a structure of a liquid crystal display panel, in which a driving circuit is integrated with the array substrate of the LCD panel.

A method for fabricating an LCD device using the silicon thin film having the improved crystallization characteristics in accordance with the present invention will now be described. FIG. 15 is a plan view illustrating a structure of a liquid crystal display panel, in which a driving circuit is integrated with the array substrate of the LCD panel.

As shown, the driving circuit-integrated LCD panel includes an array substrate 820, a color filter substrate 830, and a liquid crystal layer (not shown) formed between the array substrate 820 and the color filter substrate 830. The array substrate 820 includes a pixel unit 825, an image display region where unit pixels are arranged in a matrix configuration, and a gate driving circuit unit 824 and a data driving circuit unit 823 positioned at an outer edge of the pixel unit 825. Though not shown, the pixel unit 825 of the array substrate 820 includes a plurality of gate lines and data lines arranged vertically and horizontally and defining a plurality of pixel regions on the substrate 820. The pixel unit further includes a thin film transistor, a switching device formed near the crossings of the gate lines and the data lines, and pixel electrodes formed at the pixel regions. As a switching device for applying a signal voltage to the pixel electrode, the thin film transistor (TFT) is a field effect transistor (FET) for controlling a flow of current by an electric field.

Of the array substrate 820, the data driving circuit unit 823 is positioned at the longer side of the array substrate 820 which is protruded compared with the color filter substrate 830, and the gate driving circuit unit 824 is positioned at the shorter side of the array substrate 820. In order to suitably output an inputted signal, the gate driving circuit unit 824 and the data driving circuit unit 823 use a thin film transistor with a CMOS (Complementary Metal Oxide Semiconductor) structure, an inverter. For reference, the CMOS is an integrated circuit with a MOS structure used for high signal processing, and needs P channel and N channel transistors. Its speed and density characteristics are in between the NMOS and the PMOS. The gate driving circuit unit 824 and the data driving circuit unit 823, which are devices for supplying a scan signal and a data signal to the pixel electrode through the gate line and the data line, are connected to an external signal input terminal (not shown) so as to control an external signal transmitted through the external signal input terminal and output it to the pixel electrode.

Though not shown, a color filter for implementing color and a common electrode, which is a counter electrode of the pixel electrode formed on the array substrate 820, are formed on the image display region 825. A spacer between the array substrate and the color filer substrate is formed to provide a uniform cell gap. The array substrate and the color filter substrate are attached by a seal pattern formed at an outer edge of the image display region, to form a unit liquid crystal display panel. The two substrates are attached through an attachment key formed at the array substrate or the color filter substrate. The driving circuit-integrated LCD panel using the polycrystalline silicon thin film has many advantages in that it has excellent device characteristics, excellent picture quality, adequate display capability and low power consumption.

Figure 16:
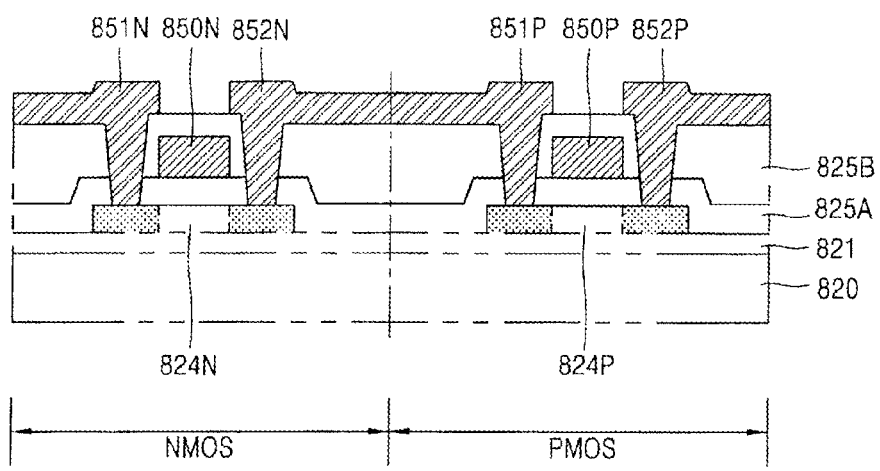
FIG. 16 illustrates an example of an LCD device fabricated using a silicon thin film crystallized by a crystallization method in accordance with the present invention.

A driving circuit-integrated LCD device using the crystallized silicon thin film fabricated according to the present invention will now be described through its fabrication process. FIG. 21 illustrates an example of an LCD device fabricated using a silicon thin film crystallized by a crystallization method in accordance with the present invention. As for the thin film transistor (TFT) formed at the pixel unit, both N-type and P-type TFT are available. For the driving circuit unit, either the N-type TFT or the P-type TFT can be used as in the pixel unit, or the CMOS structure having both the N-type TFT and the P-type TFT can be also used. Herein, FIG. 16 illustrates an example of the CMOS liquid crystal display device.

A method for fabricating the CMOS LCD device will be described as follows. First, a buffer layer 821 made of a silicon oxide film ($SiO_2$) is formed on a substrate 820 made of a transparent insulation material such as glass. Next, active layers 824N and 824P made of polycrystalline silicon are formed on the buffer layer-formed substrate 820. To this end, after an amorphous thin film is formed on the entire surface of the substrate 820, the active layers 824N and 824P are sequentially laterally solidified by a four-shot crystallization method that is in accord with the present invention. At this time, the four-shot crystallization method uses a laser mask having four blocks, each block having a periodic pattern. Accordingly, a uniform polycrystalline silicon thin film can be formed without a shot mark.

Thereafter, the crystallized polycrystalline silicon thin film is patterned through a photolithography process in order to form the active patterns 824N and 824P at the NMOS and PMO regions. Then, a gate insulation film 825A is deposited on the active layers 824N and 824P. Subsequently, gate electrodes 850N and 850P made of molybdenum (Mo), aluminum (Al), an aluminum alloy or the like is formed on a certain region (namely, a channel formation region of the active layers 824N and 824P) on the gate insulation film 825. The gate electrodes 850N and 850P are formed by a photolithography process after a gate metal is deposited on the gate insulation film 825A. Then, a N-doping process and a P-doping process are sequentially performed to form an N-type TFT (namely, a TFT having source/drain regions 822N and 823 formed by implanting N+ ions at a certain region of the active layer 824N) and a P-type TFT. At this time, the source region 822N and the drain region 823N of the N-type TFT are formed by injecting a fifth-group element such as phosphor (P) that can donate an electron. The source/drain regions 822P and 823P of the P type TFT are formed by injecting a third-group element such as boron (B) that can donate a hole. Thereafter, an interlayer insulation film 825B is deposited on the entire surface of the substrate 820, and contact holes 860N and 860P are formed to expose a portion of the source/drain regions 822N, 822P, 823N and 823P by a the photolithography process. Finally, source/drain electrodes 851N, 851P, 852N and 852P are formed to be electrically connected with the source/drain regions 822N, 822P, 823N and 823P through the contact holes 860N and 860P, thereby completing a CMOS liquid crystal display device. Although the present invention presents a method for fabricating a LCD device having the crystallized silicon thin film, the principles of the present invention can be also applied to other display devices such as an organic EL, without being limited thereto.

As so far described, the laser mask and the crystallization method according to the present invention have many advantages. A laser mask according to the present invention has four blocks, each block having its own periodic pattern. With a crystallization method according to the present invention, which uses the laser mask, a polycrystalline silicon thin film can be obtained without an X overlap or a Y overlap, that is, without a shot mark, by repeatedly applying the four blocks. In addition, by fabricating a liquid crystal display device using the polycrystalline silicon thin film, the device can have uniform and improved characteristics due to the crystallization characteristics of the active layer. Moreover, because the active layer does not have a shot mark, the picture quality of the liquid crystal display device can be also improved.

It will be apparent to those skilled in the art that various modifications and variations can be made in the above-discussed display device and the driving method thereof without departing from the spirit or scope of the invention. Thus, it is intended that the present invention cover the modifications and variations of this invention provided they come within the scope of the appended claims and their equivalents.

What is claimed is:

1. A method for fabricating a display device comprising:
    forming a plurality of gate lines and data lines on a substrate, the gate and data lines crossing each other to define pixels; and
    forming a thin film transistor (TFT) near each crossing in the pixel including:
    providing a substrate having a silicon thin film,
    positioning a laser mask having first to fourth blocks on the substrate, each block having a periodic pattern including a plurality of transmitting regions and a blocking region,
    wherein the laser mask includes a first mask pattern in the first block, a second mask pattern in the second block, a third mask pattern in the third block and a fourth mask pattern in the fourth block, each first to fourth blocks having a periodic pattern including a plurality of transmitting regions and a blocking region and
    wherein the first mask pattern with a position 'A', the second mask pattern with a position of 'B', the third mask pattern with a position of 'C' and the fourth mask pattern with a position of 'D' are formed in the first to fourth blocks, respectively, and the positions 'A' to 'D' are different from each other; and
    crystallizing the silicon thin film by irradiating a laser beam through the laser mask.

2. The method of claim 1, wherein when the first to fourth mask patterns are projected in one block, the centers of the four adjacent transmitting regions form one equilateral rectangle.

3. The method of claim 2, wherein with respect to the first mask pattern in the first block, the second mask pattern is shifted downward as much as the length of one side of the equilateral rectangle, the third mask pattern in the third block is shifted rightward as much as the length of one side of the equilateral rectangle, and the fourth mask pattern in the fourth block is shifted rightward and downward as much as the length of one side of the equilateral rectangle.

4. The method of claim 1, wherein the irradiated laser has an energy density of a complete melting region.

5. The method of claim 1, wherein the crystallization is a sequential lateral solidification (SLS).

6. The method of claim 1, wherein the crystallized silicon thin film is substantially free from a shot mark.

7. The method of claim 1, wherein crystallizing the silicon thin film by irradiating a laser beam through the laser mask further comprises:
    crystallizing the silicon film by a four-shot method, the four shot method further including:
    irradiating a first laser on a certain region of the silicon thin film through the laser mask,
    moving the laser mask or a stage having the substrate in a direction of an X axis and irradiating a second laser through the laser mask,
    moving the laser mask or the stage in the direction of the X axis and irradiating a third laser through the laser mask,
    moving the laser mask or the stage in the direction of the X axis and irradiating a fourth laser through the laser mask;
    repeatedly performing crystallization of the silicon thin film by the four-shot method in the direction of the X axis; and
    moving the laser mask or the stage in a direction of a Y axis and repeatedly performing the four-shot method in the direction of –X axis using the laser mask.

8. The method of claim 7, wherein the laser mask or the stage is moved by about a distance equal to a size of one block.

9. The method of claim 7, wherein a movement distance of the laser mask or the stage is determined in order to remove an X-overlap or a Y-overlap.

10. The method of claim 1, wherein the transmitting regions have a circular shape.

11. The method of claim 1, wherein the transmitting regions have a shape of an equilateral polygon, the polygon including an equilateral triangle, an equilateral rectangle, hexagon and octagon.

12. The method of claim 11, wherein a distance between the centers of the transmitting regions is L, a radius of the transmitting regions is R, and L and R have a relationship of $$\frac{L}{2\sqrt{2}} \le R < \frac{L}{2}.$$

13. The method of claim 1, wherein the transmitting regions in each block are arranged in an N columns×M rows matrix configuration (each of N and M is an integer).

* * * * *